(12) United States Patent
Lee et al.

(10) Patent No.: US 10,983,726 B2
(45) Date of Patent: Apr. 20, 2021

(54) STORAGE DEVICE AND METHOD OF OPERATING THE SAME FOR DETECTING LAST PROGRAMMED PAGE

(71) Applicant: SK hynix Inc., Icheon-si (KR)

(72) Inventors: Geu Rim Lee, Suwon-si (KR); Jae Min Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 6 days.

(21) Appl. No.: 16/513,352

(22) Filed: Jul. 16, 2019

(65) Prior Publication Data
US 2020/0133574 A1    Apr. 30, 2020

(30) Foreign Application Priority Data

Oct. 30, 2018 (KR) .......................... 10-2018-0131155

(51) Int. Cl.
| G06F 3/06 | (2006.01) |
| G11C 16/10 | (2006.01) |
| G11C 16/26 | (2006.01) |
| G11C 16/24 | (2006.01) |
| G11C 16/04 | (2006.01) |
| G11C 16/08 | (2006.01) |

(52) U.S. Cl.
CPC .......... G06F 3/0659 (2013.01); G06F 3/0604 (2013.01); G06F 3/0673 (2013.01); G11C 16/10 (2013.01); G11C 16/26 (2013.01); G11C 16/0483 (2013.01); G11C 16/08 (2013.01); G11C 16/24 (2013.01)

(58) Field of Classification Search
CPC .... G06F 3/0659; G06F 3/0604; G06F 3/0673; G11C 16/10; G11C 16/26; G11C 16/0483; G11C 16/08; G11C 16/24
See application file for complete search history.

(56) References Cited

U.S. PATENT DOCUMENTS

| 2012/0069664 A1* | 3/2012 | Kim | G11C 16/0483 |
| | | | 365/185.11 |
| 2018/0059968 A1* | 3/2018 | Jung | G06F 3/0619 |
| 2020/0073753 A1* | 3/2020 | Kim | G06F 3/0679 |

FOREIGN PATENT DOCUMENTS

| KR | 10-2017-0006976 | 1/2017 |
| KR | 10-2017-0110768 | 10/2017 |

* cited by examiner

*Primary Examiner* — Sean D Rossiter
(74) *Attorney, Agent, or Firm* — Perkins Coie LLP

(57) ABSTRACT

Circuit designs and operating techniques for a storage device that includes, in one implementation, a memory device including a plurality of memory blocks, each memory block including a plurality of memory cells coupled to a plurality of corresponding word lines; and a memory controller configured to store data in memory cells included in a main area coupled to a selected word line of the plurality of word lines, and store word-line information in a spare area coupled to the selected word line to indicate that a program operation has been performed on the main area.

20 Claims, 17 Drawing Sheets

STORAGE DEVICE AND METHOD OF OPERATING THE SAME FOR DETECTING LAST PROGRAMMED PAGE

CROSS-REFERENCE TO RELATED APPLICATION

This patent document claims priority to and benefits of the Korean patent application number 10-2018-0131155 filed on Oct. 30, 2018, which is incorporated herein by reference in its entirety.

TECHNICAL FIELD

Various embodiments of the disclosed technology generally relate to an electronic device, and more particularly, to a storage device and a method of operating the storage device.

BACKGROUND

A storage device is a device that is capable of storing data in a storage medium. Such a storage device is used by computing devices such as a personal computer, a smartphone, or a tablet computer to store and retrieve data. The storage device can be classified based on the type of storage medium. For example, a hard disk drive (HDD) uses a magnetic disk as the storage medium, and a solid state drive (SSD) or a memory card uses a semiconductor memory, such as a nonvolatile memory, as the storage medium.

The storage device implemented using semiconductor memories may include a plurality of memory devices and a memory controller configured to control the memory device to store and retrieve data in and from the memory device. The memory device may be classified into a volatile memory and a nonvolatile memory. Representative examples of the nonvolatile memory include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc.

SUMMARY

Various embodiments of the disclosed technology relate to a storage device having an enhanced operating speed, and a method of operating the storage device.

An embodiment of the disclosed technology may provide for a storage device including, a memory device including a plurality of memory blocks, each memory block including a plurality of memory cells coupled to a plurality of corresponding word lines and a memory controller coupled to communicate with the memory device and configured to store data in memory cells included in a main area coupled to a selected word line of the plurality of word lines, and store word-line information in a spare area coupled to the selected word line to indicate that a program operation has been performed on the main area.

An embodiment of the disclosed technology may provide for a method of operating a storage device, including, controlling, as part of operation of the storage device, a plurality of memory cells coupled to each of a plurality of word lines coupled to one or more of a plurality of memory blocks included in a memory device, storing data in memory cells included in a main area among selected memory cells coupled to a selected word line of the plurality of word lines and storing word-line information indicating a location of the selected word line in memory cells included in a spare area among the selected memory cells.

An embodiment of the present disclosure may provide for a storage device including: a memory device including a plurality of memory cells coupled to a plurality of corresponding word lines coupled to a memory block; and a memory controller configured to store data in memory cells included in a main area among selected memory cells that are the plurality of memory cells coupled to a selected word line of the plurality of word lines, and store detect data indicating a position of the selected word line in memory cells included in a spare area among the selected memory cells.

An embodiment of the present disclosure may provide for a method of operating a storage device, including: programming a plurality of memory cells coupled to each of a plurality of word lines coupled to any one memory block of a plurality of memory blocks included in a memory device; storing data in memory cells included in a main area among selected memory cells that are the plurality of memory cells coupled to a selected word line of the plurality of word lines; and storing detect data indicating a location of the selected word line in memory cells included in a spare area among the selected memory cells.

DETAILED DESCRIPTION

Figure 1:
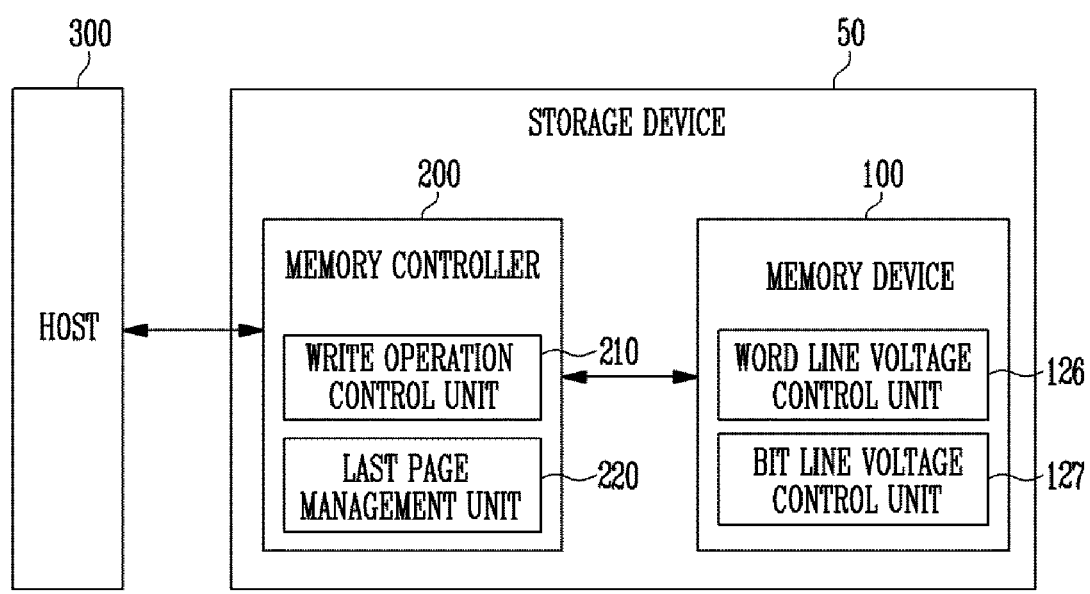
FIG. 1 is a block diagram illustrating an example of a storage device in accordance with an embodiment of the disclosed technology.

The technology disclosed in this patent document can be implemented in embodiments to provide a storage device having an enhanced operating speed by efficiently detecting a last programmed page.

Specific structural or functional descriptions in the embodiments of the present disclosure disclosed technology introduced in this specification or application are only for description of the embodiments of the present disclosure disclosed technology. The descriptions should not be construed as being limited to the embodiments described in the specification or application.

The present disclosure disclosed technology will not be described in detail based on embodiments. The present disclosure disclosed technology may, however, be embodied in many different forms and should not be construed as being limited to only the embodiments set forth herein, but should be construed as covering modifications, equivalents or alternatives falling within ideas and technical scopes of the present invention. However, it is to be understood that the present description is not intended to limit the present disclosure disclosed technology to those exemplary embodiments, and the present disclosure disclosed technology is intended to cover not only the exemplary embodiments, but also various alternatives, modifications, equivalents and other embodiments that fall within the spirit and scope of the present disclosure disclosed technology.

It will be understood that, although the terms "first", "second", etc. may be used herein to describe various elements, these elements should not be limited by these terms. These terms are only used to distinguish one element, from another element. For instance, a first element discussed below could be termed a second element without departing from the teachings of the present disclosure disclosed technology. Similarly, the second element could also be termed the first element.

It will be understood that when an element is referred to as being "coupled" or "connected" to another element, it can be directly coupled or connected to the other element or intervening elements may be present there between. In contrast, it should be understood that when an element is referred to as being "directly coupled" or "directly connected" to another element, there are no intervening elements present. Other expressions that explain the relationship between elements, such as "between", "directly between", "adjacent to" or directly adjacent to" should be construed in the same way.

The terminology used herein is for the purpose of describing particular embodiments only and is not intended to be limiting. In the present disclosure disclosed technology, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure disclosed technology belongs. It will be further understood that terms used herein should be interpreted as having a meaning that is consistent with their meaning in the context of this specification and the relevant art and will not be interpreted in an idealized or overly formal sense unless expressly so defined herein.

Detailed description of functions and structures well known to those skilled in the art will be omitted to avoid obscuring the subject matter of the present disclosure disclosed technology. This aims to omit unnecessary description so as to make the subject matter of the present disclosure disclosed technology clear.

Various embodiments of the present disclosure disclosed technology will now be described more fully hereinafter with reference to the accompanying drawings, in which preferred embodiments of the present disclosure disclosed technology are shown, so that those of ordinary skill in the art can easily carry out the technical idea of the present disclosure disclosed technology.

FIG. 1 is a block diagram illustrating an example of a storage device 50 in accordance with an embodiment of the disclosed technology.

Referring to FIG. 1, the storage device 50 may include a memory device 100 and a memory controller 200.

The storage device 50 may be a device that is used by a host 300 such as a cellular phone, a smartphone, an MP3 player, a laptop computer, a desktop computer, a game machine, a TV, a tablet PC, or an in-vehicle infotainment system, to retain data files of the host 300.

The storage device 50 may be configured of any one of various kinds of storage devices depending on a host interface, which is a communication interface between the host 300 and its peripheral devices. For example, the data storage device 50 may be configured to implement various storage devices such as an SSD, MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-E) type storage device, a compact flash (CF) card, a smart media card, and a memory stick.

The storage device 50 may be manufactured in the form of various package types. For instance, the storage device 50 may be manufactured in the form of various package types such as a package on package (POP) type, a system in package (SIP) type, a system on chip (SOC) type, a multi-chip package (MCP) type, a chip on board (COB) type, a wafer-level fabricated package (WFP) type, and a wafer-level stack package (WSP) type.

The memory controller 200 may control overall operations of the storage device 50.

When power is applied to the storage device 50, the memory controller 200 may execute firmware. In the case where the memory device 100 is a flash memory device, the memory controller 200 may execute firmware such as a flash translation layer (FTL) for controlling communication between the host 300 and the memory device 100.

The memory controller 200 may include a write operation control unit 210.

The write operation control unit 210 may receive a write request from the host 300. The write operation control unit 210 may provide a program command for storing data to the memory device 100 in response to the write request. The write operation control unit 210 may determine a word line in which the data is to be stored in response to the write request. If the word line in which the data is to be stored is determined, the write operation control unit 210 may generate word-line information indicating a position of the corresponding word line. If the word-line information is generated, the write operation control unit 210 may generate a program command for programming the data and the word-line information. The write operation control unit 210 may provide the program command to the memory device 100.

The memory device 100 may store data therein. The memory device 100 may operate under control of the memory controller 200. The memory device 100 may include a memory cell array including a plurality of memory cells configured to store data therein. The memory cell array may include a plurality of memory blocks. Each memory block may include a plurality of memory cells. Each memory block may include a plurality of pages, each of which includes a plurality of memory cell. In an embodiment, each page (e.g., logical page) may be the unit of data in the memory device 100. For example, the user of NAND flash memory device can read data or write data from or to the memory device 100 on a page basis. In the NAND flash device, however, erase operations are performed on a block basis. In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In this specification, for the sake of explanation, it is assumed that the memory device 100 is a NAND flash memory.

In the NAND flash memory, a plurality of memory cell transistors is connected in series to form a memory cell string. Each cell string is coupled to a bit line, and word lines are coupled to memory cell transistors of each memory cell string in parallel. Read voltages, which are used as a reference voltage for read operations, and program voltages, which are used to program memory cells, are applied to a word line such that all the memory cells electrically connected to the word line are read or programmed simultaneously. Thus, the memory cells connected the same word line are often called "page." The page (e.g., physical page) can be split into a plurality of logical pages if the memory cells are configured to store more than one data bit per memory cell.

In an embodiment, the memory device 100 may be embodied in a three-dimensional array structure. The disclosed technology may be applied not only to a flash memory in which a charge storage layer is formed of a conductive floating gate (FG), but also to a charge trap flash (CTF) memory in which a charge storage layer is formed of an insulating layer.

In an embodiment, each of the memory cells included in the memory device 100 may be formed of a single-level cell (SLC) capable of storing one data bit per memory cell. Alternatively, each of the memory cells included in the memory device 100 may be formed of a multi-level cell (MLC) capable of storing two data bits per memory cell, a triple-level cell (TLC) capable of storing three data bits per memory cell, or a quad-level cell (QLC) capable of storing four data bits per memory cell.

The memory device 100 may receive a command and an address from the memory controller 200 and access an area of the memory cell array that is selected by the address. In other words, the memory device 100 may perform an operation corresponding to the command on the area selected by the address. For example, the memory device 100 may perform a write (program) operation, a read operation, and an erase operation. During a program operation, the memory device 100 may write data to an area selected by an address. During a read operation, the memory device 100 may read data from an area selected by an address. During an erase operation, the memory device 100 may erase data from an area selected by an address.

The memory device 100 may perform a program operation or an erase operation using a set of operating voltages under control of the memory controller 200.

The memory device 100 may include a word line voltage control unit 126 and a bit line voltage control unit 127.

During a read operation, the word line voltage control unit 126 may control read voltages to be applied to word lines coupled to a memory block. In some embodiments of the disclosed technology, in the case where a plurality of pages included in the memory block are simultaneously read, the word line voltage control unit 126 may apply the same read voltages to all of the word lines coupled to the memory block.

In various embodiments of the disclosed technology, read voltages can be simultaneously applied to two or more word lines coupled to one memory block. In detail, all the word lines connected to a memory block may be grouped into two or more word line groups. In the case where the memory cells of a memory block are read by word line group, the word line voltage control unit 126 may apply read voltages having the same level or read voltages having different levels to respective word line groups.

The bit line voltage control unit 127 may control bit line voltages to be applied to bit lines.

For example, the bit line voltage control unit 127 may apply program enable voltages to bit lines that are coupled to memory cells selected for a program operation (e.g., memory cells coupled to a selected word line in a program operation). In an embodiment, the program enable voltage may be a ground voltage (0 V). The bit line voltage control unit 127 may apply program inhibit voltages to bit lines that are coupled to memory cells other than the memory cells selected for a program operation. The bit line voltage control unit 127 may also apply program inhibit voltages to bit lines that are coupled to memory cells that have passed a program verification among the memory cells coupled to the selected word line.

The bit line voltage control unit 127 may control a reference voltage/current for the read voltage to detect threshold voltage levels of memory cells to identify whether the memory cells are in a programmed threshold voltage status (and which one of a plurality of programmed threshold voltage distributions) or an erased threshold voltage status.

The technology disclosed in this patent document can be implemented in embodiments to identify a last programmed page upon power-up following an interruption of a program operation such as an interruption by the user or a sudden power off during a program operation. In some embodiments of the disclosed technology, bit line voltages applied during a read operation for detecting a last programmed page can be different from bit line voltages applied during a normal read operation. In other words, a bit line voltage to be applied to each bit line for a read operation for detecting a last programmed page may have a different voltage level compared to that of a voltage used to read the memory cells coupled to the selected word line during a normal read operation. Furthermore, depending on the number of programmed memory cells coupled to each bit line, a bit line voltage to be applied to the bit line may vary.

In an embodiment, the memory controller 200 may receive data and a logical address (LA) from the host 300, and may translate the LA into a physical address (PA) indicating addresses of memory cells in the memory device 100 to which data is to be stored. In addition, the memory controller 200 may store, in a buffer memory, mapping information indicating a mapping relationship between the LA and the PA.

The memory controller 200 may control the memory device 100 to perform a program operation, a read operation, or an erase operation in response to a request from the host 300. During the program operation, the memory controller 200 may provide a program command, a PA, and data to the memory device 100. During a read operation, the memory controller 200 may provide a read command and a PA to the memory device 100. During an erase operation, the memory controller 200 may provide an erase command and a PA to the memory device 100.

In an embodiment, the memory controller 200 may autonomously generate a program command, an address and data without a request from the host 300, and transmit them to the memory device 100. For example, the memory controller 200 may provide a command, an address and data to the memory device 100 to perform background operations such as a program operation for wear leveling, and a program operation for garbage collection.

In an embodiment, the memory controller 200 may include a last page management unit 220. When a program operation is interrupted during a page programming, the last page management unit 220 may detect a last programmed page in a memory block on which a program operation has been being performed. For example, upon power-up following an interruption of the program operation such as an interruption by the user or a sudden power off (SPO) where the electrical power is suddenly lost or cut off, the address of the last page that was programmed before the interruption of the program operation can be determined by the last page management unit 220. The last page management unit 220 may detect a last programmed page which is a page that has been programmed last in the memory block on which the program operation has been being performed among the plurality of memory blocks included in the memory device 100. SPO events or other interruptions during the normal operation of the storage device may cause errors in the reading or writing operation or even damage the storage device. Accordingly, it is desirable to provide a sensing circuit such as a SPO sensing unit to detect occurrence of SPO.

If the program operation is interrupted before completion of a scheduled programming task, there is a need to detect the last programmed page to resume the program operation from the last programmed page.

In an example implementation, the last programmed page can be detected by sequentially reading a plurality of word lines from the first to the last. During these read operations, if the memory device 100 reads a certain page and it is found to be an erased page, a page that has been read just before the erased page is treated as the last programmed page.

As the number of word lines required to be read is increased, however the time it takes to read the word lines may be increased, and a read disturbance may be caused.

In an embodiment of the disclosed technology, the memory device 100 may store word-line information indicating an address (or location) of a word line on which a program operation has been performed. If a program operation is interrupted, the memory controller 200 may read the word-line information to detect the last programmed page.

For example, when data is stored in the memory device 100, the last page management unit 220 may generate word-line information for each word line connected to selected memory cells or page in which the data is to be written. The last page management unit 220 may write both the data and the word-line information in the memory device 100. In an embodiment of the disclosed technology, the data may be written in a main area of a memory cell array (not shown), and the word-line information may be written in a spare area.

Upon power-up following an interruption of the program operation such as an interruption by the user or a sudden power off, the last page management unit 220 may provide a last page read command to the memory device 100. In response to the last page read command, the memory device 100 may perform a read operation on a plurality of pages included in a selected memory block.

In an embodiment, the memory device 100 may obtain last programmed page information by reading the word-line information stored in the spare area of the selected memory block. In some implementations, the last programmed page information may include page address information as to the last programmed page. The memory device 100 may provide the last programmed page information to the last page management unit 220. For example, in response to the last page read command, the memory device 100 may provide word-line information of a memory block on which the program operation has been performed last among the plurality of memory blocks included in the memory device 100 to the memory controller 200 as the last programmed page information.

The last page management unit 200 may detect the last programmed page using the last programmed page information received from the memory device 100.

In an embodiment, the memory controller 200 may control at least two memory devices 100. In this case, the memory controller 200 may control the memory devices 100 in an interleaving manner to enhance the operating performance.

The host 300 may communicate with the storage device 50 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
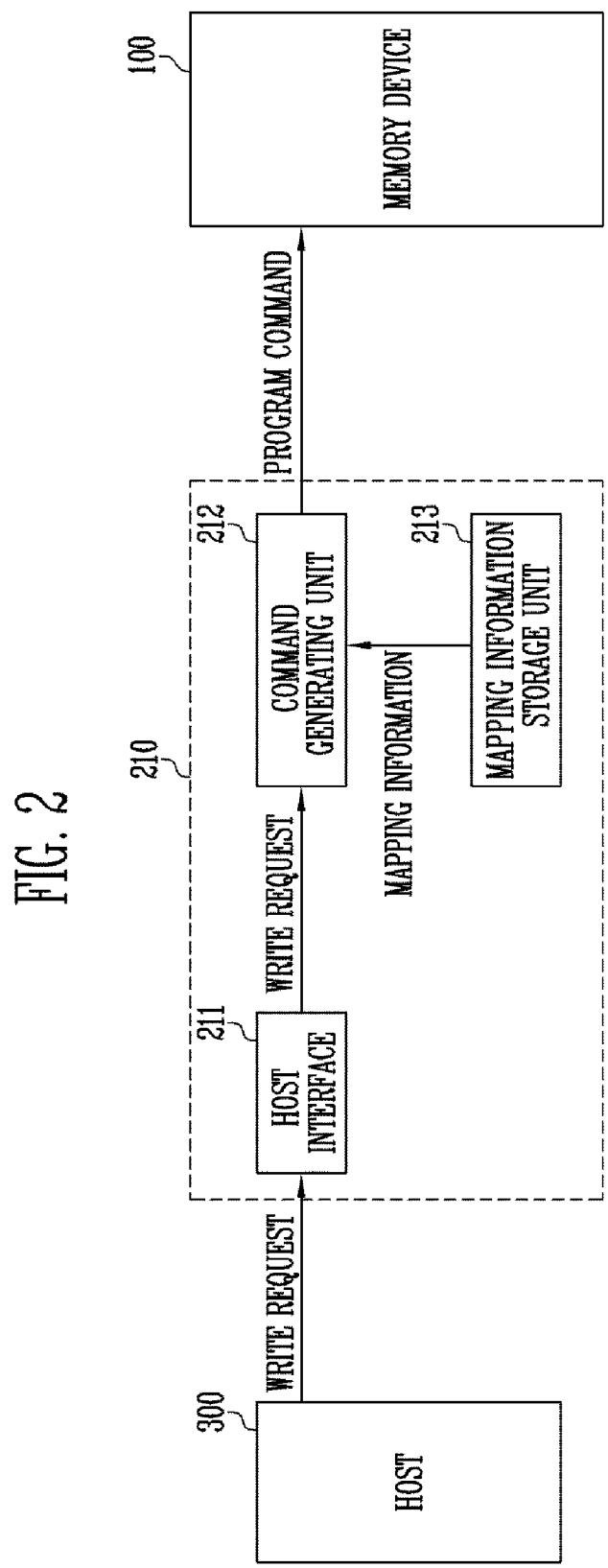
FIG. 2 is a diagram illustrating an example of the configuration of a write operation control unit of FIG. 1.

FIG. 2 is a diagram illustrating the configuration of the write operation control unit 210 of FIG. 1.

The memory controller 200 implemented based on some embodiments of the disclosed technology may include the write operation control unit 210. Although the last page management unit 220 is not shown in FIG. 2, it can be included in the memory controller 200. The write operation control unit 210 included in the memory controller 200 may include a host interface 211, a command generation unit 212, and a mapping information storage unit 213.

The host interface 211 may receive a write request from the host 300. The write request may be a request for storing data in the memory device 100. The host interface 211 may provide the write request received from the host 300 to the command generation unit 212.

The command generation unit 212 may generate a program command based on the write request received from the host interface 211.

For example, the command generation unit 212 may determine a word line connected to memory cells selected for a program operation based on the write request. The command generation unit 212 may receive mapping information from the mapping information storage unit 213 to determine the word line selected based on the write request. The command generation unit 212 may generate an address to perform the program operation thereon based on the write request according to the mapping information.

If the word line in which the data is to be stored is determined, the command generation unit 212 may generate word-line information to indicate a location of the word line coupled to the memory cells on which the program operation is to be performed. The command generation unit 212 may generate a program command for storing the write request data received from the host and the word-line information in the memory device 100. The generated program command may be provided to the memory device 100.

The mapping information storage unit 213 may provide mapping information to the command generation unit 212. Based on the mapping information, a received LA is translated to a PA indicating addresses of memory cells of the memory device 100 in which the data is to be stored. According to the mapping information provided to the command generation unit 212, the word line is selected so that the data associated with the write request received from the host 300 is stored in the memory cells coupled to the selected word lines.

Figure 3:
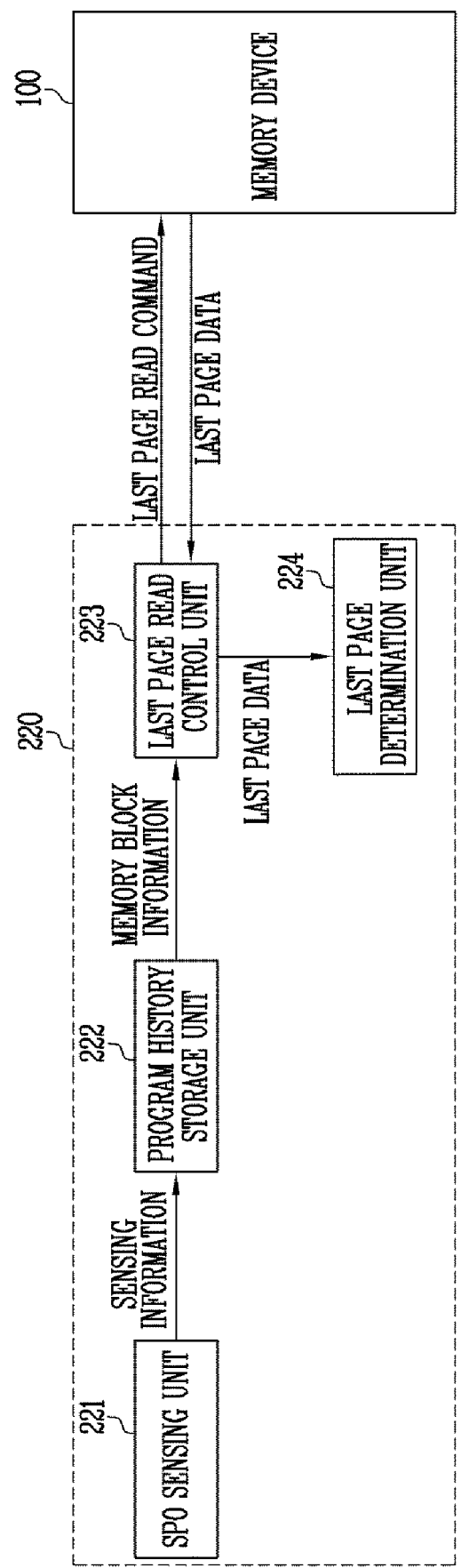
FIG. 3 is a diagram illustrating an example of the configuration of a last page management unit of FIG. 1.

FIG. 3 is a diagram illustrating an example of the configuration of the last page management unit 220 of FIG. 1.

The memory controller 200 implemented based on some embodiments of the disclosed technology may include the last page management unit 220. Although the write operation control unit 210 is not shown in FIG. 3, it can be included in the memory controller 200. The last page management unit 220 included in the memory controller 200 may include a SPO sensing unit 221, a program history storage unit 222, a last page read control unit 223, and a last page determination unit 224. Although the SPO sensing unit 221 is named "SPO sensing," the term SPO should be construed as including all the possible program operation interruption scenarios such as an interruption by the user or a sudden power off.

The SPO sensing unit 221 may sense a SPO event that has occurred in the memory device 100. If an SPO event has occurred, memory block information about a memory block to which the last programmed page belongs may be needed to perform a recovery operation.

The SPO sensing unit 221 may monitor the level of a voltage to be supplied to the storage device 50 described with reference to FIG. 1. When the level of a power supply voltage drops to or below a predetermined level, the SPO sensing unit 221 may determine that an SPO event has occurred. When the SPO event occurs, SPO event sensing information may be provided to the program history storage unit 222.

The program history storage unit 222 may provide, to the last page read control unit 223, the memory block information about the memory block to which the last programmed page belongs. In an implementation, the program history storage unit 222 may provide, to the last page read control unit 223, the memory block information about the memory block on which the program operation has been performed last before the SPO event occurs among the plurality of memory blocks included in the memory device 100.

In an embodiment, the program history storage unit 222 may include the mapping information. The mapping information may be information about mapping relationship between LAs and PAs. The program history storage unit 222 may generate, using the mapping information, the memory block information about the memory block on which the program operation has been performed last before the SPO event occurs.

The last page read control unit 223 may perform an operation of detecting a last page which is a page that has been programmed last.

For example, the last page read control unit 223 may provide a last page read command to the memory device 100. The last page read command may be a command for detecting the last page. The memory device 100 that has received the last page read command may perform, using the memory block information, a read operation on the corresponding memory block.

The memory device 100 may perform the read operation on all of the word lines coupled to the corresponding memory block, or may divided all of the word lines into groups and perform the read operation on each of the groups. During each read operation, the memory device 100 may apply read voltages having the same level or read voltages having different levels to the word lines. The memory device 100 may provide, to the last page read control unit 223, last programmed page information which is a result of reading the word lines of the corresponding memory block. The last programmed page information may be data for detecting a last programmed page.

The last page determination unit 224 may receive the last programmed page information from the last page read control unit 223. The last page determination unit 224 may detect, using the last programmed page information, a last programmed page in the memory block in which the SPO event has occurred. If the last page determination unit 224 detects the last programmed page, the memory device 100 may rewrite, to another page, the data to be stored to the last programmed page.

Figure 4:
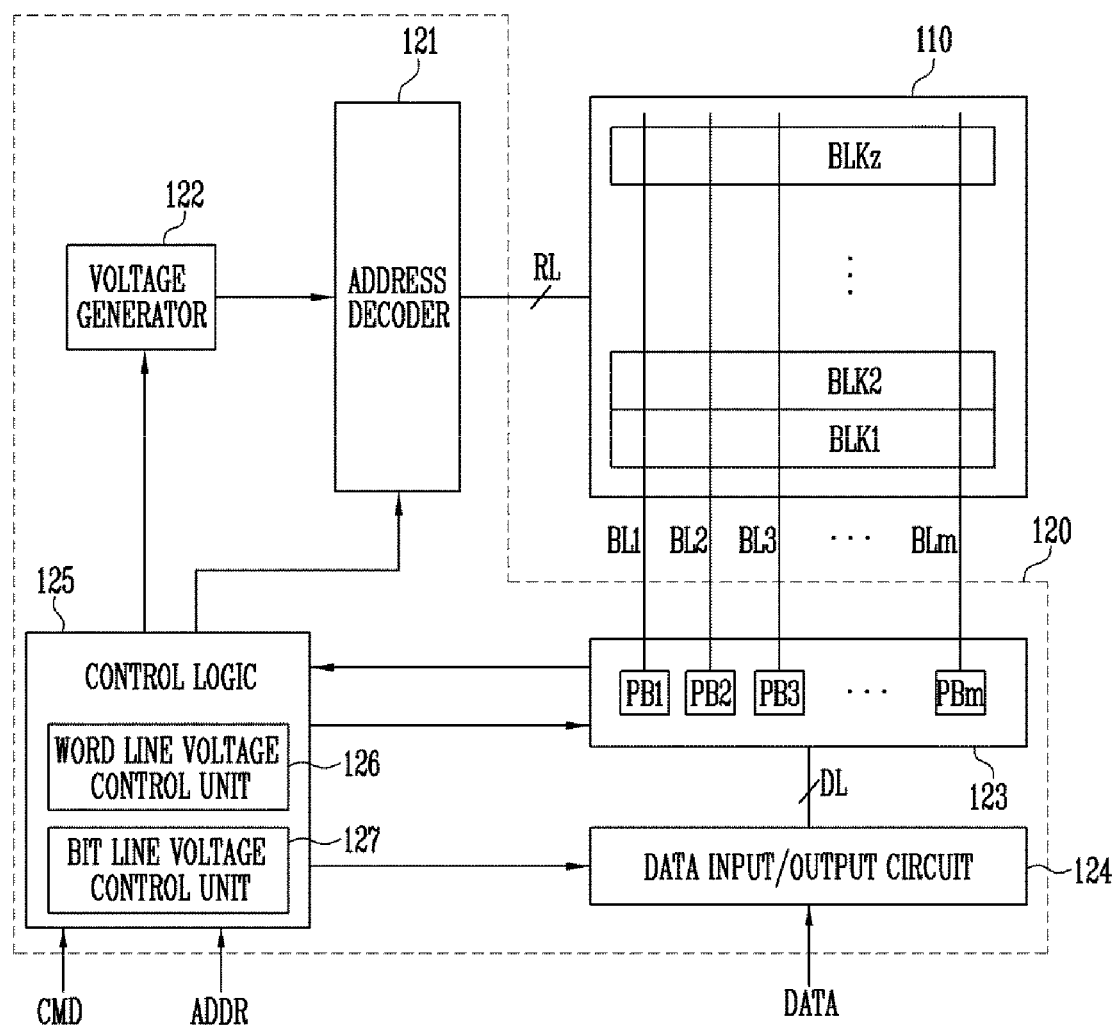
FIG. 4 is a diagram illustrating an example of the configuration of a memory device of FIG. 1.

FIG. 4 is a diagram illustrating an example of the configuration of the memory device 100 of FIG. 1.

Referring to FIG. 4, the memory device 100 may include a memory cell array 110, a peripheral circuit 120, and a control logic 125.

The memory cell array 110 may include a plurality of memory blocks BLK1 to BLKz. The memory blocks BLK1 to BLKz are connected to an address decoder 121 through row lines RL. The memory blocks BLK1 to BLKz are connected to a read/write circuit 123 through bit lines BL1 to BLm. Each of the memory blocks BLK1 to BLKz may include a plurality of memory cells. In an embodiment, the plurality of memory cells may be nonvolatile memory cells.

The memory cells included in the memory cell array 110 may be grouped into a plurality of blocks according to the purpose of use. System information including various setting information required to control the memory device 100 may be stored in the plurality of blocks.

Each of the first to z-th memory blocks BLK1 to BLKz includes a plurality of memory cell strings. First to m-th cell strings are respectively coupled to the first to m-th bit lines BL1 to BLm. Each of the first to m-th cell strings includes a drain select transistor, a plurality of memory cells coupled in series to each other, and a source select transistor. The drain select transistor DST is coupled to a drain select line DSL. First to n-th memory cells are respectively coupled to first to n-th word lines. The source select transistor SST is coupled to a source select line SSL. A drain of the drain select transistor DST is coupled to the corresponding bit line. The drain select transistors DST of the first to m-th cell strings are respectively coupled to the first to m-th bit lines BL1 to BLm. A source of the source select transistor SST is coupled to a common source line CSL. In an embodiment, the common source line CSL may be coupled in common to the first to z-th memory blocks BLK1 to BLKz. The drain select line DSL, the first to n-th word lines WL1 to WLn, and the source select line SSL are included in the row lines RL. The drain select line DSL, the first to n-th word lines WL1 to WLn, and the source select line SSL are controlled by the address decoder 121. The common source line CSL is controlled by the control logic 125. The first to m-th bit lines BL1 to BLm are controlled by the read/write circuit 123.

The peripheral circuit 120 may include the address decoder 121, a voltage generator 122, the read/write circuit 123, a data input/output circuit 124, and the control logic 125.

The address decoder 121 is coupled to the memory cell array 110 through the row lines RL. The address decoder 121 may operate under control of the control logic 125. The address decoder 121 receives addresses ADDR through the control logic 125.

In an embodiment, a program operation and a read operation of the memory device 100 may be performed on a page basis.

During the program operation or the read operation, addresses ADDR received by the control logic 125 may include a block address and a row address. The address decoder 121 may decode a block address among the received addresses ADDR. The address decoder 121 selects a corresponding one of the memory blocks BLK1 to BLKz in response to the decoded block address.

The address decoder 121 may decode a row address among the received addresses ADDR. In response to the decoded row address, the address decoder 121 may apply voltages, provided from the voltage generator 122, to the row lines RL and select one word line of the selected memory block.

During an erase operation, the addresses ADDR may include a block address. The address decoder 121 may decode the block address and select a corresponding memory block in response to the decoded block address. The erase operation may be performed on the entirety or a portion of one memory block.

During a partial erase operation, the addresses ADDR may include block and row addresses. The address decoder 121 may select a corresponding one of the memory blocks BLK1 to BLKz in response to the decoded block address.

The address decoder 121 may decode row addresses among the received addresses ADDR. In response to the decoded row addresses, the address decoder 121 may apply voltages, provided from the voltage generator 122, to the row lines RL and select at least one word line of the selected memory block.

In an embodiment, the address decoder 121 may include a block decoder, a word line decoder, an address buffer, etc.

The voltage generator 122 may generate a plurality of voltages using an external supply voltage supplied to the memory device 100. The voltage generator 122 may operate under control of the control logic 125.

In an embodiment, the voltage generator 122 may generate an internal supply voltage by regulating the external supply voltage. The internal supply voltage generated from the voltage generator 122 may be used as an operating voltage of the memory device 100.

In an embodiment, the voltage generator 122 may generate a plurality of voltages using the external supply voltage or the internal supply voltage. For example, the voltage generator 122 may include a plurality of pumping capacitors for receiving the internal supply voltage, and generate a plurality of voltages by selectively activating the plurality of pumping capacitors under control of the control logic 125. The generated voltages are applied to selected word lines by the address decoder 121.

During a program operation, the voltage generator 122 may generate a program pulse having a high voltage and a pass pulse lower than the program pulse in voltage level. During a read operation, the voltage generator 122 may generate a read voltage and a pass voltage higher than the read voltage. During an erase operation, the voltage generator 122 may generate an erase voltage.

The read/write circuit 123 may include first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm may operate under control of the control logic 125.

The first to m-th page buffers PB1 to PBm may perform data communication with the data input/output circuit 124. During a program operation, the first to m-th page buffers PB1 to PBm may receive data to be stored through the data input/output circuit 124 and data lines DL.

During the program operation, the first to m-th page buffers PB1 to PBm may transmit the data, received through the data input/output circuit 124, to selected memory cells through the bit lines BL1 to BLm when a program pulse is applied to a selected word line. The memory cells in the selected page are programmed based on the transmitted data. A memory cell coupled to a bit line to which a program enable voltage (e.g. a ground voltage) is applied may have an increased threshold voltage. The threshold voltage of a memory cell coupled to a bit line to which a program inhibit voltage (for example, a supply voltage) is applied may be retained. During a program verify operation, the first to m-th page buffers PB1 to PBm may read page data from selected memory cells through the bit lines BL1 to BLm.

During a read operation, the read/write circuit 123 may read data from the memory cells in the selected page through the bit lines BL, and output the read data to the data input/output circuit 124. During an erase operation, the read/write circuit 123 may float the bit lines BL.

In an embodiment, the read/write circuit 123 may include a column select circuit.

The data input/output circuit 124 is coupled to the first to m-th page buffers PB1 to PBm through the data lines DL. The data input/output circuit 124 may operate under control of the control logic 125. During a program operation, the data input/output circuit 124 may receive data to be stored from an external controller (not shown).

The control logic 125 is connected to the address decoder 121, the voltage generator 122, the read/write circuit 123, and the data input/output circuit 124. The control logic 125 may control overall operations of the memory device 100. The control logic 125 may receive a command CMD and addresses ADDR from the external controller. The control logic 125 may control the address decoder 121, the voltage generator 122, the read/write circuit 123, and the data input/output circuit 124 in response to the command CMD.

In an embodiment, the control logic 125 may include the word line voltage control unit 126 and the bit line voltage control unit 127.

The word line voltage control unit 126 may generate read voltages that can be used to identify a last programmed page.

For example, the word line voltage control unit 126 implemented based on some embodiments of the disclosed technology may identify the last programmed page by simultaneously applying read voltages to a plurality of word lines respectively coupled to a plurality of pages included in a memory block or by simultaneously applying read voltages to at least two or more word lines among a plurality of word lines coupled to the memory block and simultaneously reading the bit lines coupled thereto.

In the case where the memory device 100 simultaneously reads the plurality of pages included in the memory block, the word line voltage control unit 126 may apply the same read voltages (read voltages having the same voltage level) to all of the word lines. In the case where the memory device 100 simultaneously reads memory cells coupled to two or more word lines among the plurality of word lines coupled to the memory block, the word line voltage control unit 126 may apply the same read voltages (read voltages having the same voltage level) to all of the word lines or the two or more word lines. The level of the read voltages may be determined based on the number of word lines coupled to the memory block and the number of bit lines.

During a read operation, the bit line voltage control unit 127 may control a bit line voltage to be applied to each bit line.

A read operation may be performed on memory cells coupled to a selected word line among a plurality of word lines. Unlike this normal read operation, the read operation for identifying the last programmed page may be performed on memory cells coupled to all of the plurality of word lines to detect a last programmed page. During each read operation, because the number of memory cells on which the read operation is to be performed varies, a reference voltage or reference current to be used during the read operation may vary. Therefore, during the read operation for detecting the last programmed page, the bit line voltage control unit 127 may apply, to a bit line, a bit line voltage different from that of the operation of reading memory cells coupled to a selected word line in the normal read operation.

Figure 5:
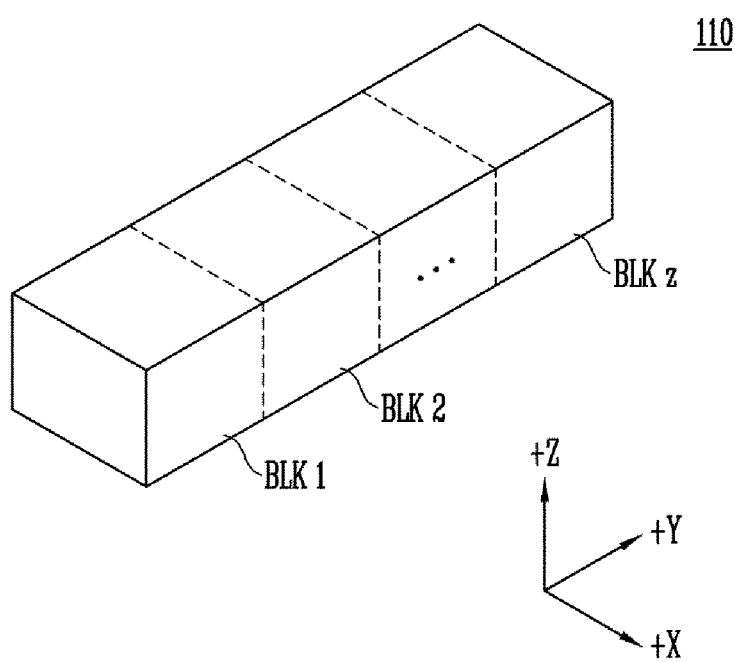
FIG. 5 is a diagram illustrating an example of a memory cell array of FIG. 4 based on an embodiment of the disclosed technology.

FIG. 5 is a diagram illustrating an example of the memory cell array 110 of FIG. 4 based on an embodiment of the disclosed technology.

Referring to FIG. 5, the memory cell array 110 may include a plurality of memory blocks BLK1 to BLKz. Each memory block may have a three-dimensional structure. Each memory block may include a plurality of memory cells stacked on a substrate. The memory cells are arranged in a +X direction, a +Y direction, and a +Z direction. The structure of each memory block will be described in more detail with reference to FIGS. 6 and 7.

Figure 6:
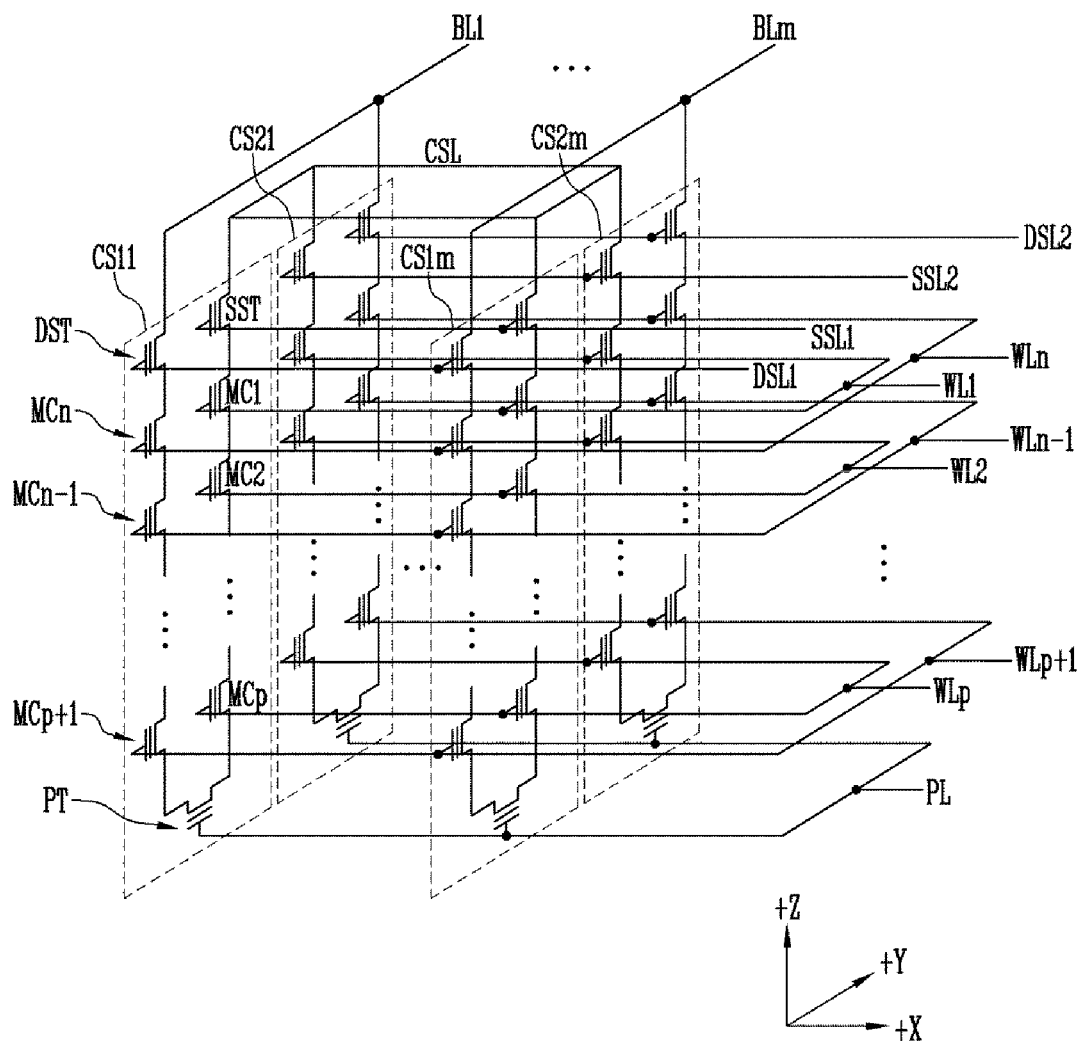
FIG. 6 is a circuit diagram illustrating one memory block BLKa of memory blocks BLK1 to BLKz of FIG. 5 based on an embodiment of the disclosed technology.

FIG. 6 is a circuit diagram illustrating any one memory block BLKa of memory blocks BLK1 to BLKz of FIG. 5 based on an embodiment of the disclosed technology.

Referring to FIG. 6, the memory block BLKa may include a plurality of cell strings CS11 to CS1m and CS21 to CS2m. Each cell string consists of a plurality of memory cells and other transistors coupled in series in a column direction as shown in the drawings. In an embodiment, each of the cell strings CS11 to CS1m and CS21 to CS2m may be formed in a 'U' shape. In the memory block BLKa, m cell strings may be arranged in a row direction (i.e., the +X direction). Although FIG. 6 depicts only two cell strings as being arranged in a column direction (i.e., the +Y direction), it will be understood that three or more cell strings may be arranged in the column direction.

Each of the plurality of cell strings CS11 to CS1m and CS21 to CS2m may include at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 6, source select transistors of the cell strings CS11 to CS1m in a first row are coupled to a first source select line SSL1. Source select transistors of the cell strings CS21 to CS2m in a second row are coupled to a second source select line SSL2.

In an embodiment, the source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite to the +Z direction and are coupled in series between the source select transistor SST and the pipe transistor PT. The p+1-th to n-th memory cells MCp+1 to MCn are sequentially arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

As discussed above, a plurality of memory cells and other transistors coupled in series in a column direction may form a cell string, and a plurality of cell strings may form a memory block. Cell strings arranged in the column direction may be coupled to bit lines extending in the column direction. In FIG. 6, cell strings CS11 and CS21 in a first column are coupled to a first bit line BL1. Cell strings CS1m and CS2m in an m-th column are coupled to an m-th bit line BLm.

Memory cells forming a plurality of cell strings in the column direction are also arranged in the row direction in which word lines are arranged. A group of memory cells that are coupled to the same word line form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. When any one of the drain select lines DSL1 and DSL2 is selected, corresponding cell strings arranged in the direction of a single row may be selected. When any one of the word lines WL1 to WLn is selected, a corresponding single page may be selected from among the selected cell strings.

In an embodiment, even bit lines and odd bit lines may be provided in lieu of the first to m-th bit lines BL1 to BLm. Even-number-th cell strings of the cell strings CS11 to CS1m or CS21 to CS2m arranged in the row direction may be coupled to respective even bit lines. Odd-number-th cell strings of the cell strings CS11 to CS1m or CS21 to CS2m arranged in the row direction may be coupled to respective odd bit lines.

In an embodiment, at least one of the first to n-th memory cells MC1 to MCn may be used as a dummy memory cell. The dummy memory cell may be identical to normal memory cells in terms of its structure, but is used for different purposes, such as reducing the effects of inter-cell interference. For example, one or more dummy memory cells may be provided to reduce an electric field between the source select transistor SST and the memory cells MC1 to MCp. Alternatively, one or more dummy memory cells may be provided to reduce an electric field between the drain select transistor DST and the memory cells MCp+1 to MCn. As such, the dummy memory cells are used to reduce undesirable interference between the select transistors and memory cells, but they can have a negative impact on the chip size. The more the dummy memory cells are disposed between the select transistors and the memory cells, the more reliable the operation of the memory block BLKa will become. However, that would inevitably lead to an increase in the size of the memory block BLKa.

To efficiently control the dummy memory cells, each of the dummy memory cells may have a predetermined threshold voltage. Before or after an erase operation is performed on the memory block BLKa, program operations may be performed on all or some of the dummy memory cells. In the case where an erase operation is performed after a program operation has been performed, the dummy memory cells may have predetermined threshold voltages by controlling voltages to be applied to the dummy word lines coupled to the respective dummy memory cells.

Figure 7:
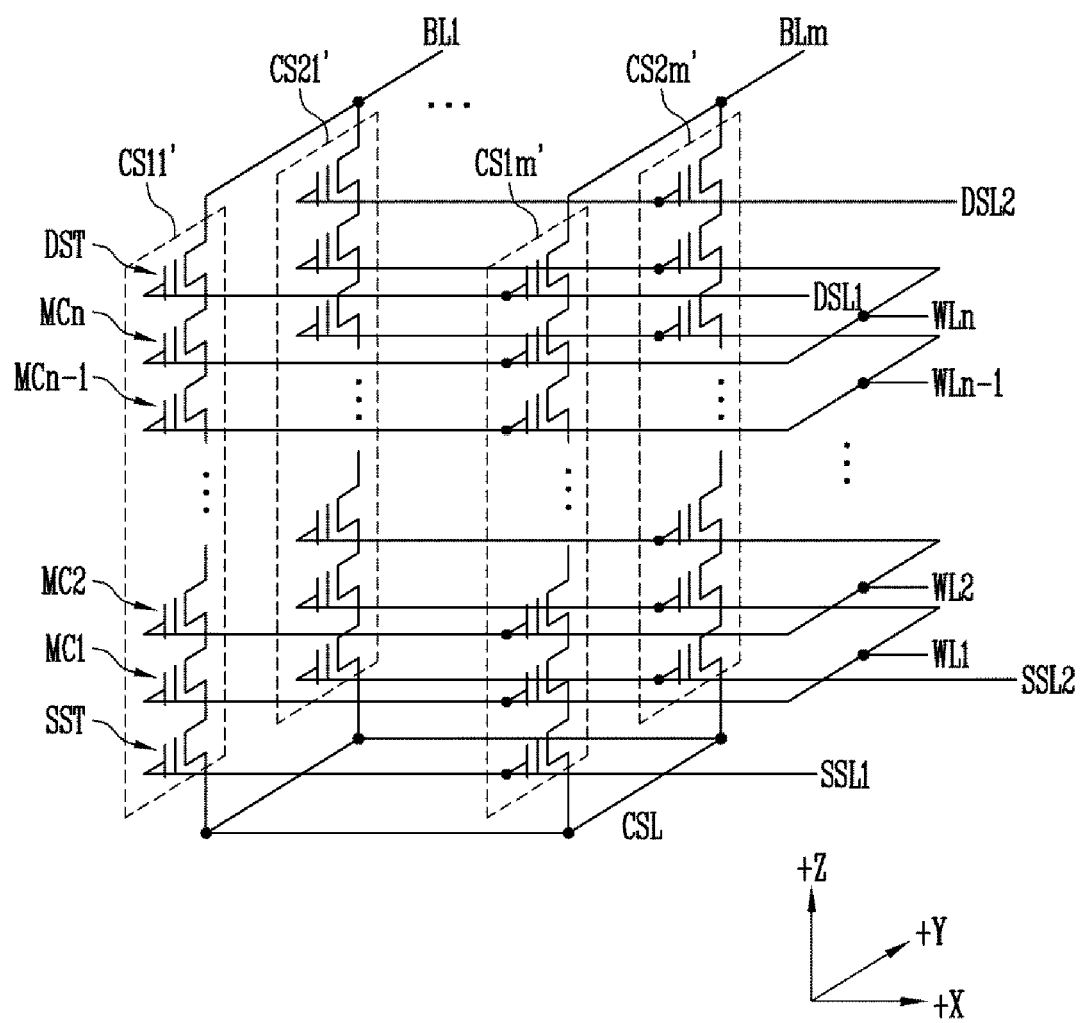
FIG. 7 is a circuit diagram illustrating one memory block BLKb of the memory blocks BLK1 to BLKz of FIG. 5 based on an embodiment of the disclosed technology.

FIG. 7 is a circuit diagram illustrating one memory block BLKb of the memory blocks BLK1 to BLKz of FIG. 5 based on an embodiment of the disclosed technology.

Referring to FIG. 7, the memory block BLKb may include a plurality of cell strings CS11' to CS1m' and CS21' to CS2m'. Each of the cell strings CS11' to CS1m' and CS21' to CS2m' extends in the +Z direction. Each cell string consists of a plurality of memory cells and other transistors coupled in series in a column direction as shown in the drawings. For example, each of the cell strings CS11' to CS1m' and CS21' to CS2m' may include at least one source select transistor SST, first to n-th memory cells MC1 to MCn, and at least one drain select transistor DST which are stacked on a substrate (not shown) provided in a lower portion of the memory block BLK1'.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1m' arranged in a first row may be coupled to a first source select line SSL1. Source select transistors of the cell strings CS21' to CS2m' arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction in the drawing. Drain select transistors of the cell strings CS11' to CS1m' in the first row are coupled to a first drain select line DSL1. Drain select transistors of the cell strings CS21' to CS2m' in the second row may be coupled to a second drain select line DSL2.

The memory block BLKb of FIG. 7 is generally similar to that of the memory block BLKa of FIG. 6, but the cell strings in memory block BLKb of FIG. 7 does not include pipe transistors PT.

In an embodiment, even bit lines and odd bit lines may be provided in lieu of the first to m-th bit lines BL1 to BLm. Even-number-th cell strings among the cell strings CS11' to CS1m' or CS21' to CS2m' arranged in the row direction may be coupled to the respective even bit lines, and odd-number-th cell strings among the cell strings CS11' to CS1m' or CS21' to CS2m' arranged in the row direction may be coupled to the respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCn. Alternatively, at least one or more dummy memory cells may be provided to reduce an electric field between the drain select transistor DST and the memory cells MC1 to MCn. As discussed above, the dummy memory cells are used to reduce undesirable interference between the select transistors and memory cells, but they can have a negative impact on the chip size.

To efficiently control the dummy memory cells, each of the dummy memory cells may have a predetermined threshold voltage. Before or after an erase operation is performed on the memory block BLKb, program operations may be performed on all or some of the dummy memory cells. In the case where an erase operation is performed after a program operation has been performed, the dummy memory cells may have predetermined threshold voltages by controlling voltages to be applied to the dummy word lines coupled to the respective dummy memory cells.

Figure 8:
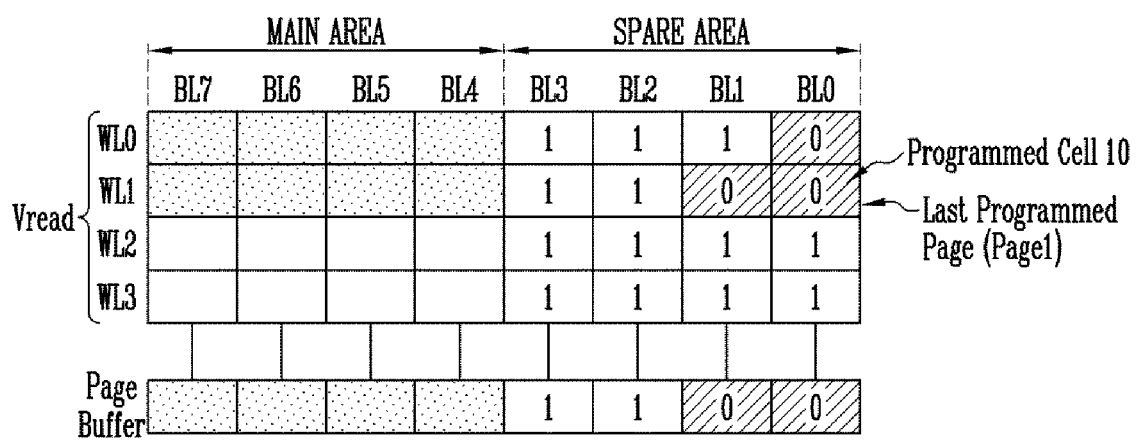
FIG. 8 is a diagram illustrating a method of programming word-line information and detecting a last programmed page using the word-line information based on an embodiment of the disclosed technology.

FIG. 8 is a diagram illustrating a method of programming word-line information and detecting a last programmed page using the word-line information based on an embodiment of the disclosed technology.

FIG. 8 illustrates one memory block of the memory blocks BLK1 to BLKz of FIG. 4 and page buffers included in the read/write circuit 123. In an embodiment, four word lines WL0 to WL3 and eight bit lines BL0 to BL7 may be coupled to the memory block. In the memory blocks, memory cells may be arranged at intersections between the word lines and the bit lines. A plurality of memory cells coupled to each word line may form a single page.

Although FIG. 8 illustrates only four word lines and eight bit lines by way of example, a larger number of word lines and a larger number of bit lines may be coupled to the memory block.

The cells included in the memory block may be divided into memory cells included in a main area and memory cells included in a spare area.

The memory cells included in the main area may be memory cells for storing data corresponding to a write request of the host 300. A shaded portion in the main area may indicate that at least one of memory cells included in the same page has been programmed.

The memory cells included in the spare area may be memory cells for storing word-line information. The word-line information may indicate the location of programmed pages. When memory cells included in the main area are programmed, corresponding memory cells included in the spare area may be programmed at the same time.

In an embodiment, a plurality of memory cells may be sequentially programmed page by page from the page corresponding to the zeroth word line WL0 to the page corresponding to the third word line WL3 (from memory cells coupled to the zeroth word line WL0 to memory cells coupled to the third word line WL3). The memory cells in the spare area are programmed such that the number of programmed memory cells in the spare area of a page can indicate the address (location) of that page. In an implementation of the disclosed technology, the spare area of pages may be programmed in an incremental manner such that the number of programmed memory cell in the spare area of pages increase as the page address increases. In other words, the number of programmed memory cells included in the spare area increases by one cell each page program. For example, as the memory cells in the main area are sequentially programmed word-line by word-line, when a first page is programmed, one outermost memory cell included in the spare area of the first page is programmed, and when a second page is programmed, two outermost memory cells in the spare area of the second page are programmed. When a third page is programmed, three outermost memory cells in the spare area of the third page are programmed. Here, the outmost memory cell can be a memory cell that is coupled to the zeroth bit line BL0, which is the outermost bit line.

For example, the last programmed page can be identified as follows. When the memory cells coupled to the zeroth word line WL0 are programmed, word-line information may be stored in the corresponding spare area to indicate that a zeroth page Page0 including the memory cells coupled to the zeroth word line WL0 has been programmed. The word-line information can be stored by programming memory cells in the corresponding spare area (e.g., spare area coupled to the zeroth word line WL0). For example, a memory cell in the corresponding spare area coupled to at least one bit line corresponding to the zeroth word line WL0 is programmed.

In an implementation, the memory cell that indicates that the zeroth page Page0 has been programmed may be the memory cell coupled to the zeroth word line WL0 and the zeroth bit line BL0. Therefore, when the memory cells in the main area of the zeroth page Page0 are programmed, the memory cell coupled to the zeroth word line WL0 and the zeroth bit line BL0 may be programmed at the same time. How the programmed memory cell coupled to the zeroth word line WL0 and the zeroth bit line BL0 can indicate the address (location) of the zeroth page Page0 on which the program operation has been performed will be discussed below.

When the memory cells coupled to the first word line WL1 are programmed, word-line information may be stored in the corresponding spare area to indicate that a first page Page1 including the memory cells coupled to the first word line WL1 has been programmed. The word-line information can be stored by programming memory cells in the corresponding spare area (e.g., spare area coupled to the first word line WL1). For example, a memory cell in the corresponding spare area coupled to at least one bit line corresponding to the first word line WL1 is programmed.

In an implementation, the memory cell that indicates that the first page Page1 has been programmed may be the memory cell coupled to the first word line WL1 and the first bit line BL1. Therefore, when the memory cells in the main area of the first page Page1 are programmed, the memory cell coupled to the first word line WL1 and the first bit line BL1 may be programmed at the same time.

After having performed the program operation, the memory device 100 may perform a last page search read operation for locating a last programmed page.

In an embodiment, the memory device 100 may simultaneously read the plurality of pages included in the memory block during the last page search read operation. In detail, in response to a last page read command, the memory device 100 may simultaneously read the plurality of pages included in the memory block on which the program operation has been performed last among the plurality of memory blocks included in the memory device 100. The memory device 100 may provide data obtained by simultaneously reading the plurality of pages to the memory controller 200 as information about the last programmed page.

To simultaneously read the plurality of pages, read voltages Vread having the same level may be applied to all of the word lines coupled to the memory block. In detail, in response to the last page read command, the memory device 100 may simultaneously apply the same read voltage to the plurality of word lines coupled to the memory block on which the program operation has been performed last among the plurality of memory blocks, and thus read information about the last programmed page.

The read voltage may be a read threshold voltage for distinguishing between an erased status and a programmed status.

The memory device 100 may read, through the bit lines, not only data stored in the main area but also word-line information indicating the address (location) of a programmed page.

In detail, in response to the last page read command, the memory device 100 may provide the word-line information of the memory block on which the program operation has been performed last among the plurality of memory blocks included in the memory device 100 to the memory controller 200 as the last programmed page information.

In an embodiment, a plurality of memory cells coupled to a bit line may be read by an AND operation, and read data may be stored in the page buffer. Among the data stored in the page buffer, the shaded portion, i.e., the data stored in the main area, may be programmed data. Among the data stored in the page buffer, the data stored in the spare area may be last programmed page information. In the case where at least one among a plurality of memory cells coupled to a bit line in the spare area has been programmed, data read through the corresponding bit line may be "0."

A bit flip may destroy the last programmed page information. As the bit flip occurs, the data bit may be changed from "0" to "1" or from "1" to "0." The bit flip may occur when a memory cell is programmed to a low level. If the last programmed page information is changed by the bit flip, it may be difficult to locate the programmed page. Therefore, to locate the zeroth page Page0, a memory cell Programmed Cell 10 coupled to the first word line WL1 and the zeroth bit line BL0 may be additionally programmed.

In this way, if the last programmed page information stored in the page buffer is "1100," this can show that the zeroth page Page0 and the first page Page1 have been programmed. Hence, it can be determined that the last programmed page is the first page Page1.

Figure 9:
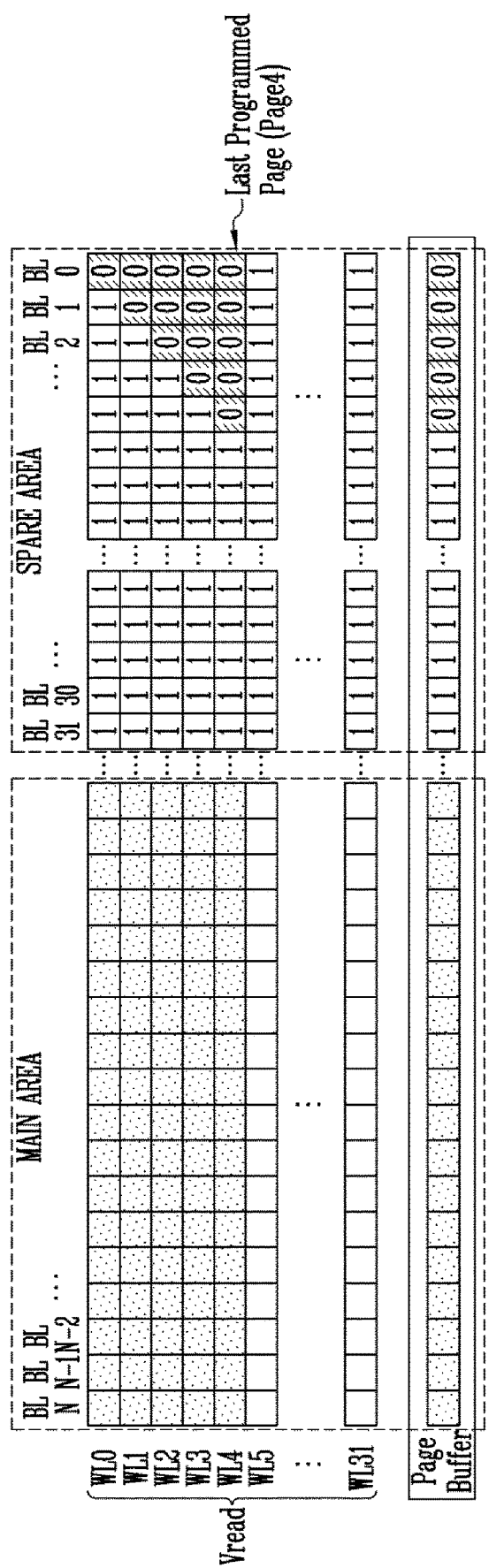
FIG. 9 is a diagram illustrating an example of a memory block implemented based on the method illustrated in FIG. 8.

FIG. 9 is a diagram illustrating an example of a memory block implemented based on the method illustrated in FIG. 8.

Although FIG. 9 illustrates that the number of word lines is 32 (WL0 to WL31) and the number of bit lines is N+1 (BL0 to BLN), a larger number of word lines and a larger number of bit lines may be coupled to the memory block. In the memory blocks, memory cells may be arranged at intersections between the word lines and the bit lines. A plurality of memory cells coupled to each word line may form a single page. In other words, memory cells coupled to the zeroth word line WL0 may form a zeroth page Page0, memory cells coupled to the first word line WL1 may form a first page Page1, memory cells coupled to the second word line WL2 may form a second page Page2, and memory cells coupled to the third word line WL3 may form a third page Page3.

In an embodiment, the memory cells included in the zeroth to fourth pages Page0 to Page4 may be programmed. A shaded portion in a main area may indicate that at least one of memory cells included in the same page has been programmed. To indicate that the memory cells included in the main area among the memory cells included in the zeroth to fourth pages Page0 to Page4 have been programmed, word-line information may be stored in the memory cells included in a spare area. The word-line information may indicate the location of programmed pages. To this end, a memory cell coupled to at least one bit line corresponding to each word line among the memory cells of the spare area may be programmed.

For example, the zeroth word line WL0 may correspond to the zeroth bit line BL0, the first word line WL1 may correspond to the first bit line BL1, the second word line WL2 may correspond to the second bit line BL2, the third word line WL3 may correspond to the third bit line BL3, and the fourth word line WL4 may correspond to the fourth bit line BL4. In other words, the word lines may correspond to the respective bit lines in a sequence from the zeroth bit line BL0 that is the outermost bit line to the third bit line BL3.

Therefore, when the memory cells coupled to the zeroth to fourth word lines WL0 to WL4 are programmed, word-line information may be stored at the same time in a memory cell coupled to each word line and the bit line corresponding to the word line. If the word-line information is stored, the last page determination unit 224 may detect that the zeroth to fourth pages Page0 to Page4 have been programmed, during a read operation to be described later.

To indicate that each page has been programmed, word-line information may be additionally stored. The reason for this is to make up for the potential loss of the word-line information that might occur due to a bit flip.

In detail, the memory cells that are coupled to the first to fourth word lines WL1 to WL4 and the zeroth bit line BL0 may be programmed to indicate the address (location) of the zeroth page Page0. The memory cells that are coupled to the second to fourth word lines WL2 to WL4 and the first bit line BL1 may be programmed to indicate the address (location) of the first page Page1. The memory cells that are coupled to the third to fourth word lines WL3 to WL4 and the second bit line BL2 may be programmed to indicate the address (location) of the second page Page2. The memory cells that are coupled to the fourth word line WL4 and the third bit line BL3 may be programmed to indicate the address (location) of the third page Page3.

After having performed the program operation, the memory device 100 may perform a last page search read operation for detecting a last programmed page.

In an embodiment, during the last page search read operation, the plurality of pages included in the memory block may be simultaneously read. To simultaneously read the plurality of pages, read voltages Vread having the same level may be applied to all of the word lines WL0 to WL31 coupled to the memory block.

The memory device 100 may read not only data stored in the main area but also word-line information indicating the position of a programmed page according to a read operation.

In an embodiment, a plurality of memory cells coupled to a bit line may be read by an AND operation that is performed on data bits stored in the memory cells coupled to the bit line, and a result of the AND operation may be stored in the page buffer. Among the data stored in the page buffer, the shaded portion, i.e., the data stored in the main area, may be programmed data. Among the data stored in the page buffer, the data stored in the spare area may be last programmed page information. In the case where at least one among a plurality of memory cells coupled to a bit line in the spare area has been programmed, data read through the corresponding bit line may be "0."

If the last programmed page information stored in the page buffer may be "11100000," this can show that the zeroth to fourth pages Page0 to Page4 have been programmed. Hence, it can be determined that the last programmed page is the fourth page Page4.

Figure 10:
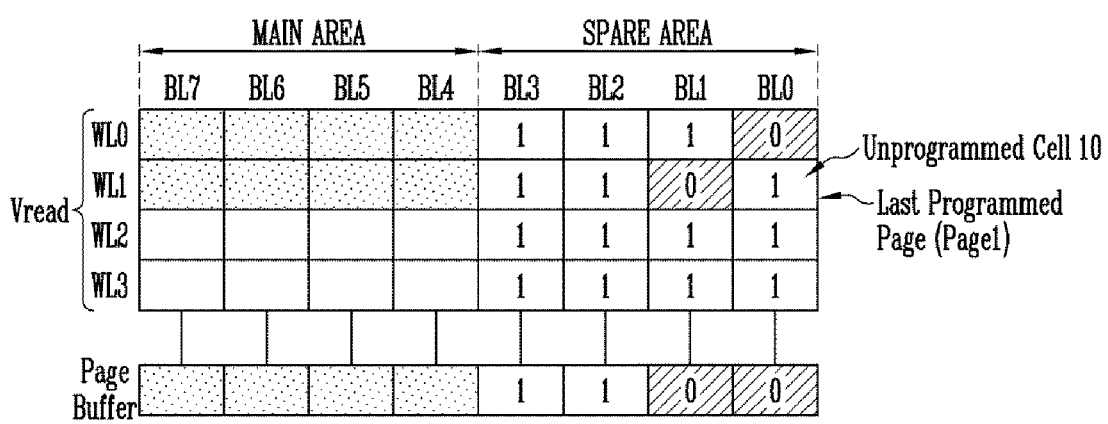
FIG. 10 is a diagram illustrating an example of a method of programming word-line information and detecting a last programmed page using the word-line information based on an embodiment of the disclosed technology.

FIG. 10 is a diagram illustrating a method of programming word-line information and detecting a last programmed page using the word-line information based on an embodiment of the disclosed technology.

Although FIG. 10 illustrates that the number of word lines is 4 (WL0 to WL3) and the number of bit lines is 8 (BL0 to BL7), a larger number of word lines and a larger number of bit lines may be coupled to the memory block. In the memory blocks, memory cells may be arranged at intersections between the word lines and the bit lines. A plurality of memory cells coupled to each word line may form a single page.

Since the embodiment of FIG. 10 other than "Unprogrammed Cell 10" is the same as the embodiment of FIG. 8, only "Unprogrammed Cell 10" will be described below.

To indicate that a first page Page1 including the memory cells coupled to the first word line WL1 has been programmed, word-line information may be stored in the spare area. To store the word-line information, the memory cell that is coupled to the first word line WL1 and the zeroth bit line BL0 may be additionally programmed. The reason for this is to make up for the potential loss of the word-line information that might occur due to a bit flip. However, if the memory cell that is coupled to the first word line WL1 and the zeroth bit line BL0 is additionally programmed, the program of memory cells may be interfered by adjacent programmed memory cells, thereby failing to reach a target programmed status (e.g., target threshold voltage).

Therefore, in some embodiment of the disclosed technology, only one memory cell that is coupled to corresponding word line and bit line is programmed to indicate that the corresponding page has been programmed.

When the pages are sequentially programmed, the memory cells included in the spare area may be programmed in a sequence from memory cells coupled to the zeroth bit line BL0 that is the outermost bit line. In detail, to indicate that the zeroth page Page0 has been programmed, the memory cell that is coupled to the zeroth word line WL0 and the zeroth bit line BL0 may be programmed. To indicate that the first page Page1 has been programmed, the memory cell that is coupled to the first word line WL1 and the first bit line BL1 may be programmed.

The memory device 100 may simultaneously read the plurality of pages included in the memory block and thus read word-line information indicating the position of a programmed page. In detail, a plurality of memory cells coupled to a bit line may be read by an AND operation that is performed on data bits stored in the memory cells coupled to the bit line, and a result of the AND operation may be stored in the page buffer. The data stored in the page buffer may be last programmed page information. In the case where at least one among a plurality of memory cells coupled to a bit line has been programmed, data read through the corresponding bit line may be "0."

Although "Unprogrammed Cell 10" that is the memory cell coupled to the first word line WL1 and the zeroth bit line BL0 is not programmed, the last programmed page information stored in the page buffer may be "1100." The last programmed page information shows that the zeroth page Page0 and the first page Page1 have been programmed. Hence, it can be determined that the last programmed page is the first page Page1.

Figure 11:
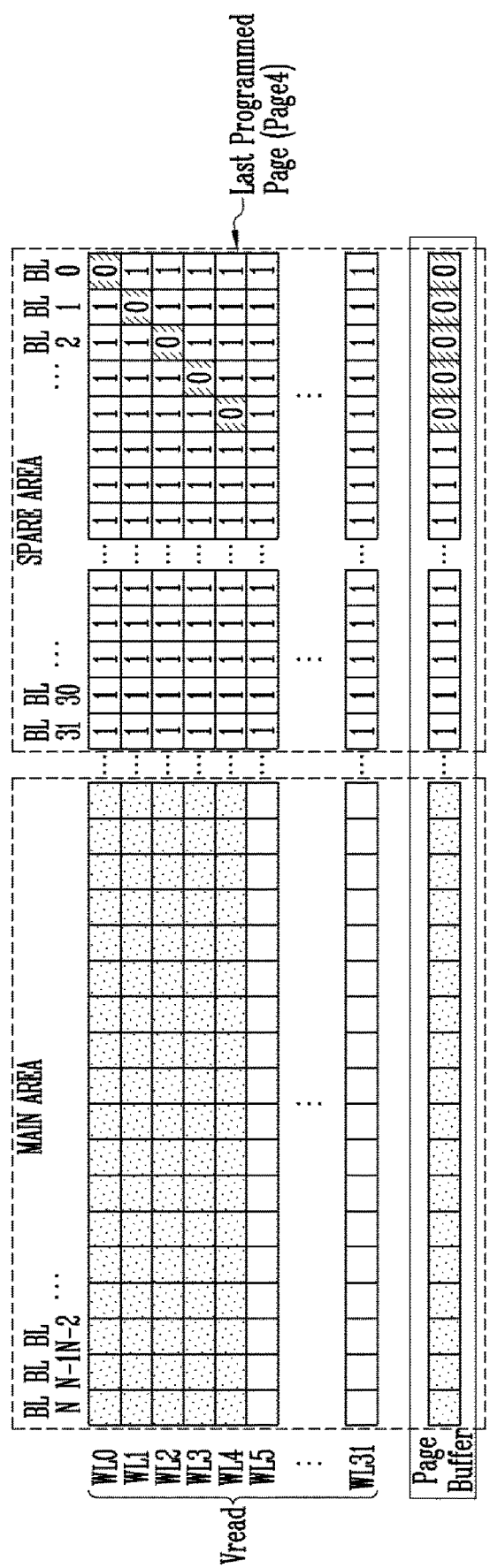
FIG. 11 is a diagram illustrating an example of a memory block implemented based on the method illustrated in FIG. 10.

FIG. 11 is a diagram illustrating an example of a memory block implemented based on the method illustrated in FIG. 10.

Although FIG. 11 illustrates that the number of word lines is 32 (WL0 to WL31) and the number of bit lines is N+1 (BL0 to BLN), a larger number of word lines and a larger number of bit lines may be coupled to the memory block. In the memory blocks, memory cells may be arranged at intersections between the word lines and the bit lines. A plurality of memory cells coupled to each word line may form a single page. In other words, memory cells coupled to the zeroth word line WL0 may form a zeroth page Page0, memory cells coupled to the first word line WL1 may form a first page Page1, memory cells coupled to the second word line WL2 may form a second page Page2, and memory cells coupled to the third word line WL3 may form a third page Page3.

Since the embodiment of FIG. 11, other than the number of memory cells in which word-line information are stored to indicate the position of a programmed page, is the same as the embodiment of FIG. 9, only a method of storing the word-line information will be described below.

The word-line information may be data indicating the position of each page. To this end, a memory cell coupled to at least one bit line corresponding to each word line among the memory cells of the spare area may be programmed. To prevent a bit flip from occurring in the last programmed page information, memory cells in the spare area may be additionally programmed. However, in the case where memory cells are additionally programmed, the program of the memory cells may be interfered by adjacent programmed memory cells, thereby failing to reach a target programmed status (e.g., target threshold voltage) by a program disturbance phenomenon and an interference phenomenon between the memory cells.

Therefore, in some embodiment of the disclosed technology, only one memory cell that is coupled to corresponding word line and bit line is programmed to indicate that the corresponding page has been programmed. For example, to indicate that the zeroth page Page0 has been programmed, the memory cell that is coupled to the zeroth word line WL0 and the zeroth bit line BL0 may be programmed. To indicate that the first page Page1 has been programmed, the memory cell that is coupled to the first word line WL1 and the first bit line BL1 may be programmed. To indicate that the second page Page2 has been programmed, only the memory cell that is coupled to the second word line WL2 and the second bit line BL2 may be programmed. To indicate that the third page Page3 has been programmed, only the memory cell that is coupled to the third word line WL3 and the third bit line BL3 may be programmed. To indicate that the fourth page Page4 has been programmed, only the memory cell that is coupled to the fourth word line WL4 and the fourth bit line BL4 may be programmed.

During a last page search read operation, the last programmed page information may be read out in the same manner although only a memory cell coupled to each word line and a bit line corresponding to the word line has been programmed. In other words, the last programmed page information stored in the page buffer may be "11100000." The last programmed page information shows that the zeroth to fourth pages Page0 to Page4 have been programmed. Hence, it can be determined that the last programmed page is the fourth page Page4.

Figure 12:
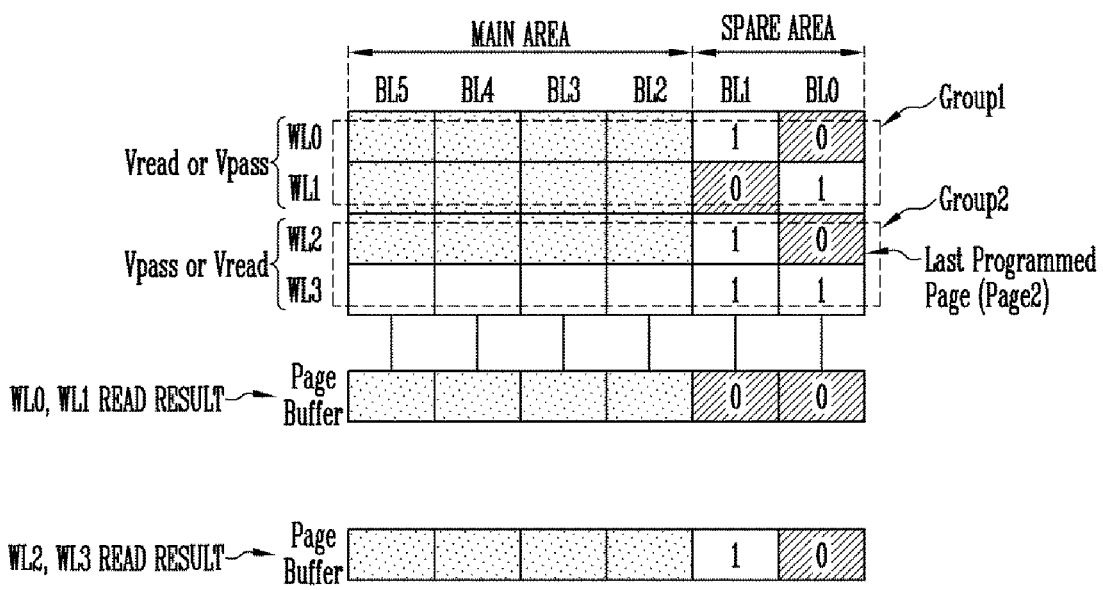
FIG. 12 is a diagram illustrating a method of programming word-line information and detecting a last programmed page using the word-line information based on an embodiment of the disclosed technology.

FIG. 12 is a diagram illustrating a method of programming word-line information and detecting a last programmed page using the word-line information based on an embodiment of the disclosed technology.

Although FIG. 12 illustrates that the number of word lines is 4 (WL0 to WL3) and the number of bit lines is 6 (BL0 to BL5), a larger number of word lines and a larger number of bit lines may be coupled to the memory block. In the memory blocks, memory cells may be arranged at intersections between the word lines and the bit lines. A plurality of memory cells coupled to each word line may form a single page.

In an embodiment, a program operation may be performed on memory cells coupled to the zeroth to second word lines WL0 to WL2 among the plurality of word lines. The memory cells coupled to the zeroth to second word lines WL0 to WL2 may form zeroth to second pages Page0 to Page2, respectively. A shaded portion in a main area may indicate that at least one of memory cells included in the same page has been programmed.

In an embodiment, the word-line information stored in the spare area may indicate the location of programmed pages. The word-line information may be stored by programming memory cells in the corresponding spare area. For example, a memory cell in the corresponding spare area coupled to at least one bit line corresponding to a word line may be programmed.

In an implementation, the total number of word lines coupled to the memory block may be greater than the number of bit lines included in the spare area. Therefore, it is assumed that even-numbered word lines correspond to the zeroth bit line BL0, and odd-numbered word lines correspond to the first bit line BL1.

The word-line information may be stored in each of the memory cell coupled to the zeroth word line WL0 and the zeroth bit line BL0, the memory cell coupled to the first word line WL1 and the first bit line BL1, and the memory cell coupled to the second word line WL2 and the zeroth bit line BL0.

The memory device 100 may perform a last page search read operation for detecting a last programmed page.

In an embodiment, the memory device 100 may simultaneously read a plurality of pages included in the memory block during the last page search read operation. For example, in response to a last page read command, the memory device 100 may simultaneously read a plurality of pages included in a memory block on which the program operation has been performed last among the plurality of memory blocks included in the memory device 100. The memory device 100 may provide data obtained by simultaneously reading the plurality of pages to the memory controller 200 as information about the last programmed page.

In an embodiment, the total number of word lines coupled to the memory block may be greater than the number of bit lines included in the spare area. In the case where the total number of word lines coupled to the memory block is large, it may be difficult to detect a last programmed page even if the last page search read operation is performed. Thus, the plurality of pages included in the memory block may be divided into a plurality of groups. A last page search read operation may be performed for each group. For example, at least two or more pages among the plurality of pages may be simultaneously read.

To simultaneously read a plurality of pages, read voltages Vread having the same level may be applied to some of the word lines coupled to the memory block. For example, in response to the last page read command, the memory device 100 may simultaneously apply read voltages having the same level to some of the plurality of word lines coupled to the memory block on which the program operation has been performed last among the plurality of memory blocks, and thus read information about the last programmed page.

In an embodiment, the plurality of pages included in the memory block may be divided into two or more groups including a first group Group1 and a second group Group2. A read operation may be performed. The zeroth page Page0 and the first page Page1 may be included in the first group Group1, and the second page Page2 and the third page Page3 may be included in the second group Group2. If the read operation is performed on the pages included in the first and second groups Group1 and Group2, the last programmed page information may be stored in the page buffer. A last programmed page may be detected by the last programmed page information.

A read operation may be first performed on the first group Group1 of the first and second groups Group1 and Group2. Read voltages Vread may be applied to the zeroth word line WL0 and the first word line WL1, and pass voltages Vpass may be applied to the second word line WL2 and the third word line WL3. The memory cells coupled to the zeroth word line WL0 and the first word line WL1 may be simultaneously read to detect whether the memory cells coupled to the zeroth word line WL0 and the first word line WL1 have been programmed.

For example, provided that the memory cell that is coupled to the zeroth word line WL0 has been programmed as illustrated in FIG. 12, a result of reading the zeroth bit line BL0 through an AND operation would be "0" regardless of whether other memory cells coupled to the zeroth bit line BL0 have been programmed. Likewise, provided that the memory cell that is coupled to the first word line WL1 has been programmed as illustrated in FIG. 12, a result of reading the first bit line BL1 through an AND operation would be "0" regardless of whether other memory cells coupled to the first bit line BL1 have been programmed.

Hence, the last programmed page information stored in the page buffer would be "00," and thus the last programmed page would not be detected by the result of reading the zeroth page Page0 and the first page Page1 and a further read operation would be necessary.

After the read operation on the first group Group1 has been performed, a read operation may be performed on the second group Group2. Pass voltages Vpass may be applied to the zeroth word line WL0 and the first word line WL1, and read voltages Vread may be applied to the second word line WL2 and the third word line WL3. The memory cells coupled to the second word line WL2 and the third word line WL3 may be simultaneously read to detect whether the memory cells coupled to the second word line WL2 and the third word line WL3 have been programmed.

Since, among the memory cells coupled to the zeroth bit line BL0, the memory cell that is coupled to the second word line WL2 has been programmed, a result of reading the zeroth bit line BL0 through an AND operation would be "0." In addition, since, among the memory cells coupled to the first bit line BL1, the memory cells that are coupled to the second word line WL2 and the third word lines WL3 have not been programmed, a result of reading the first bit line BL1 would be "1."

Hence, the last programmed page information stored in the page buffer would be "10." Since the last programmed page information is "10," it can be determined that the last programmed page is the second page Page2.

Figure 13:
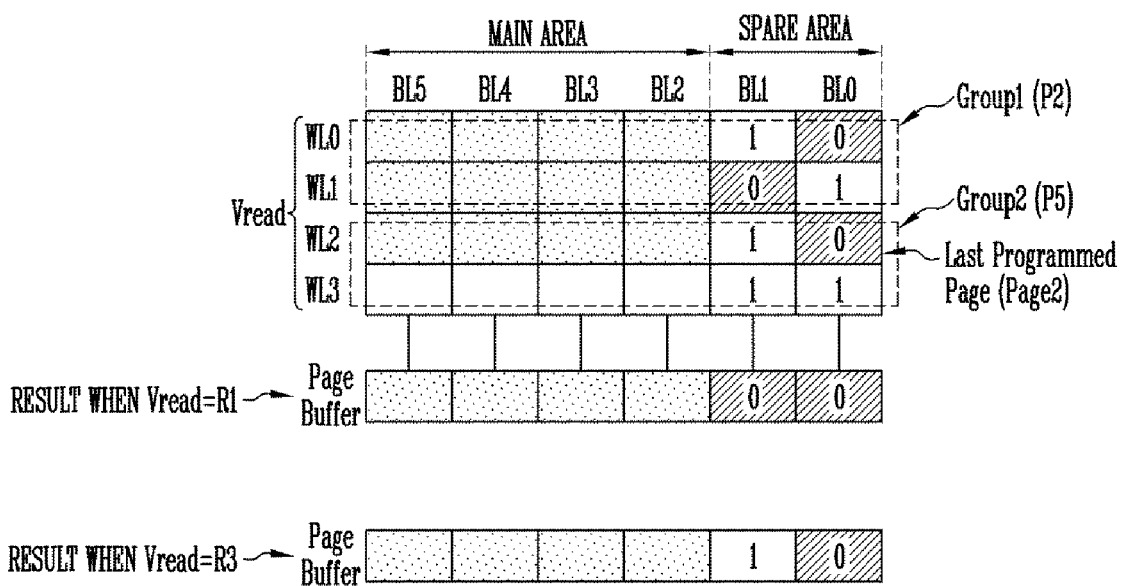
FIG. 13 is a diagram illustrating a method of programming word-line information and detecting a last programmed page using the word-line information based on an embodiment of the disclosed technology.

FIG. 13 is a diagram illustrating a method of programming word-line information and detecting a last programmed page using the word-line information based on an embodiment of the disclosed technology.

Although FIG. 13 illustrates that the number of word lines is 4 (WL0 to WL3) and the number of bit lines is 6 (BL0 to BL5), a larger number of word lines and a larger number of bit lines may be coupled to the memory block. In the memory blocks, memory cells may be arranged at intersections between the word lines and the bit lines. A plurality of memory cells coupled to each word line may form a single page.

In an embodiment, the word-line information for indicating that each page including memory cells coupled to the corresponding word line has been programmed may be stored in the spare area. In FIG. 13, a shaded portion in a main area may indicate that at least one of memory cells included in the same page has been programmed. The word-line information may indicate the address (location) of a programmed page.

The total number of word lines coupled to the memory block may be greater than the number of bit lines included in the spare area. Therefore, it is assumed that even-numbered word lines correspond to the zeroth bit line BL0, and odd-numbered word lines correspond to the first bit line BL1.

To store the word-line information, memory cells in the spare area may be programmed by group. Although the memory cells in the spare area are programmed to a single target programmed state (e.g., target threshold voltage), the memory cells may be programmed to different target program states for respective groups. Therefore, target programmed states of the memory cells included in the first group Group1 and the second group Group2 among the memory cells in the spare area may be different from each other. It is assumed that the target programmed state of the memory cells included in the first group Group1 is a second programmed state P2, and the target programmed state of the memory cells included in the second group Group2 is a fifth programmed state P5.

The word-line information may be stored in the spare area by programming the memory cells in the spare area to indicate that zeroth to second pages Page0 to Page2 have been programmed.

For example, among the memory cells included in the first group Group1, the memory cell that is coupled to the zeroth word line WL0 and the zeroth bit line BL0, and the memory cell that is coupled to the first word line WL1 and the first bit line BL1 may be programmed to the second programmed state P2. Furthermore, the memory cell that is coupled to the second word line WL2 and the zeroth bit line BL0 among the memory cells included in the second group Group2 may be programmed to the fifth programmed state P5.

After the word-line information has been stored in at least one corresponding memory cell for each group, a last page search read operation for detecting a last programmed page may be performed. In some implementations of the disclosed technology, if the memory cells in the spare area are programmed by group, there is no need for the memory device 100 to read the plurality of pages by group. Hence, the last programmed page may be detected by applying read voltages having different levels to all of the word lines coupled to the memory blocks.

In an embodiment, the memory device 100 may simultaneously read the plurality of pages included in the memory block during the last page search read operation. For example, in response to a last page read command, the memory device 100 may simultaneously read the plurality of pages included in the memory block on which the program operation has been performed last among the plurality of memory blocks included in the memory device 100. The memory device 100 may provide data obtained by simultaneously reading the plurality of pages to the memory controller 200 as information about the last programmed page.

In an embodiment, to detect the last programmed page, read voltages having the same level may be applied to all of the word lines coupled to the memory block. For example, in response to the last page read command, the memory device 100 may simultaneously apply read voltages having the same level to the plurality of word lines coupled to the memory block on which the program operation has been performed last among the plurality of memory blocks, and thus read information about the last page.

If it is impossible to detect the last programmed page by applying the read voltages to all of the word lines coupled to the memory block, read voltages of another level may be applied to all of the word lines.

The level of a read voltage for detecting whether the zeroth page Page0 and the first page Page1 have been programmed may be a first read voltage R1 which distinguishes between an erased status and the second programmed status P2. The first read voltage R1 may be applied to all of the word lines coupled to the memory block.

In the case where all of the pages included in the memory block are read by the first read voltage R1, the last programmed page information stored in the page buffer may be "00." The last programmed page information shows that the zeroth page Page0 and the first page Page1 have been programmed. Therefore, a last programmed page may not be detected by the read operation using the first read voltage R1.

The level of a read voltage for detecting whether the second page Page2 and the third page Page3 have been programmed may be a third read voltage R3 which distinguishes between the second programmed state P2 and the fifth programmed state P5.

In the case where all of the pages included in the memory block are read by the third read voltage R3, the last programmed page information stored in the page buffer may be "10." The last programmed page information shows that the second page Page2 has been programmed. Hence, it can be determined that the last programmed page is the second page Page2.

Figure 14:
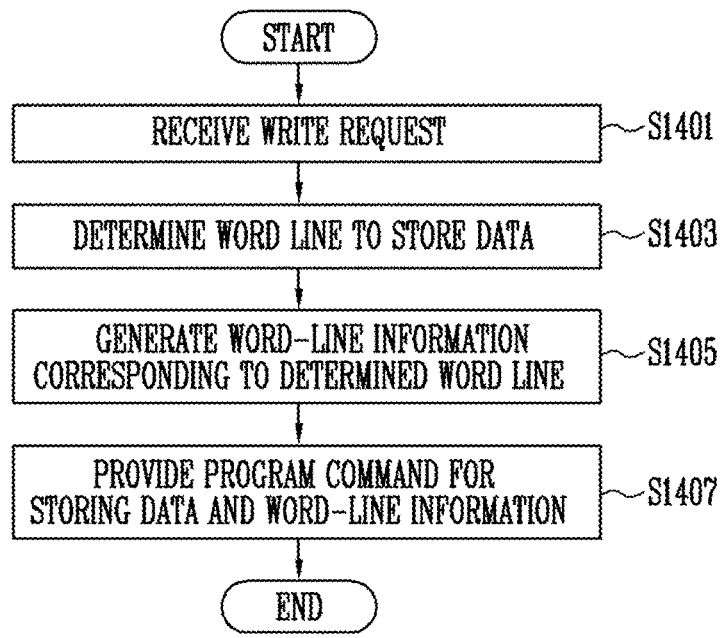
FIG. 14 is a diagram illustrating an operation of the memory device based on an embodiment of the disclosed technology.

FIG. 14 is a diagram illustrating an operation of the memory device 100 based on an embodiment of the disclosed technology.

Referring to FIG. 14, at step S1401, the host interface 211 may receive a write request from the host 300. The write request may be a request for storing data in the memory device 100.

At step S1403, the command generation unit 212 may determine a word line on which the write request received from the host interface 211 is to be performed. The command generation unit 212 may determine a word line in which data is to be stored according to the write request and mapping information received from the mapping information storage unit 213.

At step S1405, the command generation unit 212 may generate word-line information corresponding to the determined word line. The word-line information may be data for indicating the position of the word line on which the program operation is to be performed.

At step S1407, the command generation unit 212 may provide, to the memory device 100, a program command for storing the data and the word-line information. The data may be data corresponding to the write request received from the host 300. The data and the word-line information may be stored in the memory device 100 according to the program command provided from the command generation unit 212.

Figure 15:
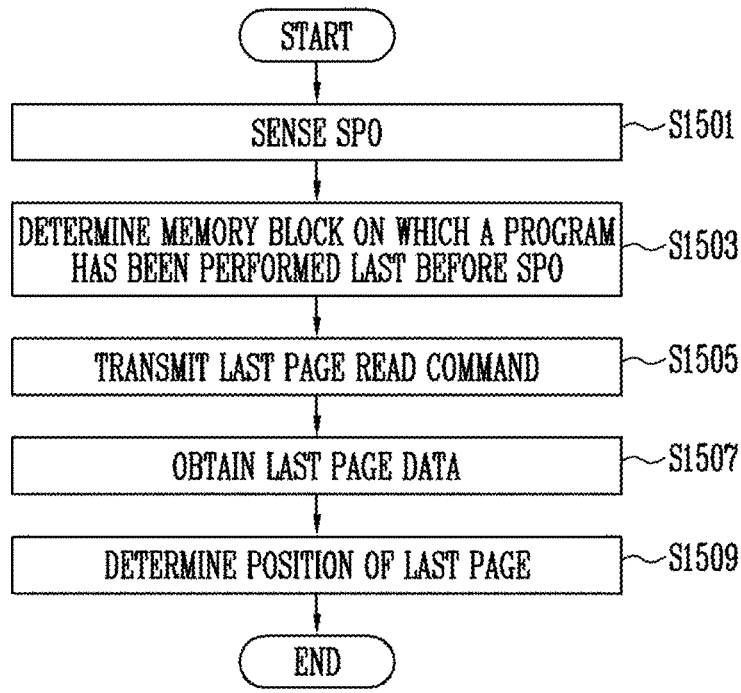
FIG. 15 is a diagram illustrating an operation of the memory controller based on an embodiment of the disclosed technology.

FIG. 15 is a diagram illustrating an operation of the memory controller 200 based on an embodiment of the disclosed technology.

Referring to FIG. 15, at step S1501, the SPO sensing unit 221 may sense that an SPO event has occurred. For a recovery from the SPO event, the SPO sensing unit 221 may provide SPO event sensing information to the program history storage unit 222.

At step S1503, a memory block on which a program operation has been performed last before the SPO event occurs may be determined using mapping information stored in the program history storage unit 222. The program history storage unit 222 may include the mapping information generated to perform the program operation. Hence, the memory block on which the program operation has been performed last before the SPO event occurs may be determined using the mapping information. The program history storage unit 222 may provide information about the corresponding memory block to the last page read control unit 223.

At step S1505, the last page read control unit 223 may provide a last page read command to the memory device 100. The memory device 100 may perform a last page search read operation in response to the last page read command. During the last page search read operation, the memory device 100 may simultaneously read all of the pages included in the memory block, or may simultaneously read some of the pages.

At step S1507, the last page read control unit 223 may obtain, from the memory device 100, last programmed page information that is a result of performing the last page search read operation. The last page read control unit 223 may provide the obtained last programmed page information to the last page determination unit 224.

At step S1509, the last page determination unit 224 may detect the position of a last programmed page using the last programmed page information. The last page determination unit 224 may detect, using the last programmed page information, the last programmed page in the memory block in which the SPO event has occurred.

Figure 16:
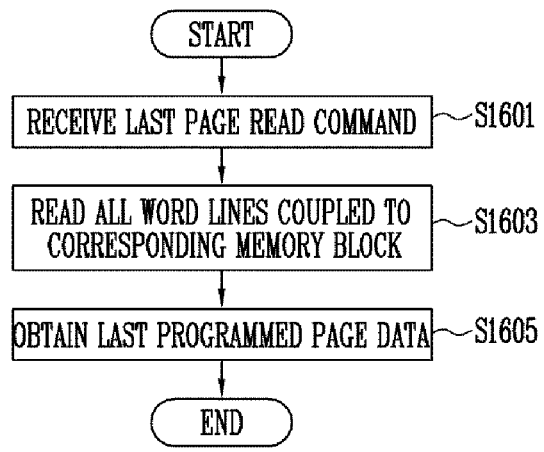
FIG. 16 is a diagram illustrating an operation of the memory device based on an embodiment of the disclosed technology.

FIG. 16 is a diagram illustrating an operation of the memory device 100 based on an embodiment of the disclosed technology.

Referring to FIG. 16, at step S1601, the memory device 100 may receive a last page read command from the last page read control unit 223. The memory device 100 may perform a last page search read operation for detecting a last programmed page in response to the last page read command.

At step S1603, when the SPO event occurs, the memory device 100 may simultaneously read, using information about a memory block on which the program operation has been performed last, all of the pages included in the memory block. To read all of the pages included in the memory block, the memory device 100 may apply read voltages having the same level or read voltages having different levels to all of the word lines coupled to the memory block.

At step S1605, the memory device 100 may obtain last programmed page information that is a result of reading word-line information indicating the position of a programmed page. The last programmed page information may be stored in the page buffer. The memory device 100 may detect the last programmed page using the last programmed page information stored in the page buffer.

Figure 17:
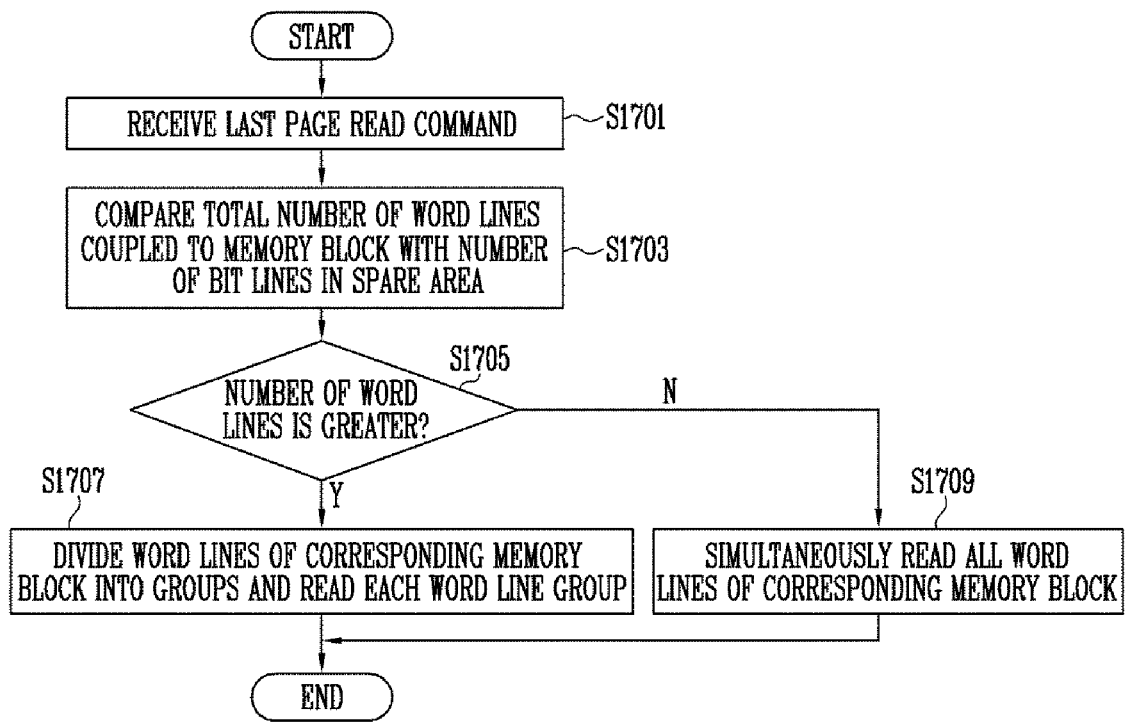
FIG. 17 is a diagram illustrating an operation of the memory device based on an embodiment of the disclosed technology.

FIG. 17 is a diagram illustrating an operation of the memory device 100 based on an embodiment of the disclosed technology.

Referring to FIG. 17, at step S1701, the memory device 100 may receive a last page read command from the last page read control unit 223. The memory device 100 may perform a last program read operation for detecting a last programmed page in response to the last page read command.

At step S1703, the total number of word lines coupled to the memory block may be compared with the number of bit lines included in the spare area. The last program read operation may be determined by comparing the total number of word lines coupled to the memory block with the number of bit lines.

At step S1705, it may be determined whether the total number of word lines coupled to the memory block is greater than the number of bit lines included in the spare area. In the case where the total number of word lines is greater than the number of bit lines included in the spare area, the process proceeds to step S1707. In the case where the total number of word lines is less than the number of bit lines included in the spare area, the process proceeds to step S1709.

At step S1707, since the total number of word lines coupled to the memory block is greater than the number of bit lines included in the spare area, the memory device 100 may divide the plurality of pages included in the memory block into groups and read the page groups. In the case where the plurality of pages are divided into groups and the page groups are read, read voltages having the same level or pass voltages having the same level may be applied to the word lines of each group.

At step S1709, since the total number of word lines coupled to the memory block is less than the number of bit lines included in the spare area, all of the pages included in the memory block may be simultaneously read. Therefore, read voltages having the same level may be simultaneously applied to all of the word lines coupled to the memory block.

Figure 18:
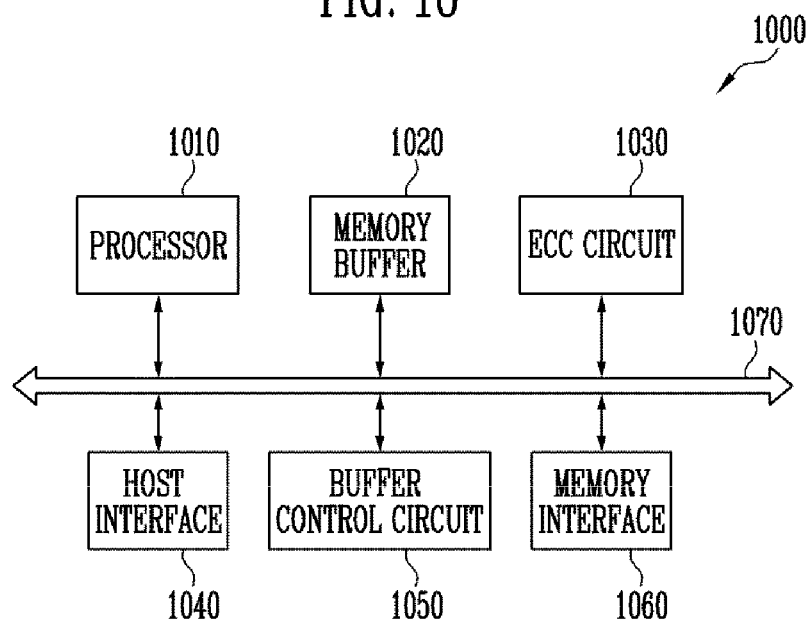
FIG. 18 is a diagram illustrating an example of the memory controller of FIG. 1.

FIG. 18 is a diagram illustrating an example of the memory controller of FIG. 1.

A memory controller 1000 is coupled to a host and a memory device. In response to a request from the host, the memory controller 1000 may access the memory device. For example, the memory controller 1000 may control a write operation, a read operation, an erase operation, and a background operation of the memory device. The memory controller 1000 may provide an interface between the memory device and the host. The memory controller 1000 may drive firmware for controlling the memory device.

Referring to FIG. 18, a memory controller 1000 may include a processor 1010, a memory buffer 1020, an error correction code (ECC) circuit 1030, a host Interface 1040, a buffer control circuit 1050, a memory interface 1060, and a bus 1070.

The bus 1070 may provide a channel between the components of the memory controller 1000.

The processor 1010 may control the overall operation of the memory controller 1000 and perform a logical operation. The processor 1010 may communicate with the external host through the host interface 1040, and communicate with the memory device through the memory interface 1060. In addition, the processor 1010 may communicate with the memory buffer 1020 through the buffer control circuit 1050. The processor 1010 may control the operation of the storage device using the memory buffer 1020 as an operating memory, a cache memory, or a buffer memory.

The processor 1010 may perform the function of a flash translation layer (FTL). The processor 1010 may translate a logical address (LA), provided by the host, into a physical address (PA) through the FTL. The FTL may receive the LA using a mapping table and translate the LA into the PA. An address mapping method using the FTL may be modified in various ways depending on the unit of mapping. Representative address mapping methods may include a page mapping method, a block mapping method, and a hybrid mapping method.

The processor 1010 may randomize data received from the host. For example, the processor 1010 may use a randomizing seed to randomize data received from the host. Randomized data may be provided to the memory device as data to be stored, and may be programmed to the memory cell array.

During a read operation, the processor 1010 may derandomize data received from the memory device 100. For example, the processor 1010 may use a derandomizing seed to derandomize data received from the memory device. Derandomized data may be output to the host.

In an embodiment, the processor 1010 may drive software or firmware to perform the randomizing operation or the derandomizing operation.

The memory buffer unit 1020 may be used as an operating memory, a cache memory, or a buffer memory of the processing unit 1010. The memory buffer unit 1020 may store codes and commands to be executed by the processing unit 1010. The memory buffer unit 1020 may store data to be processed by the processing unit 1010. The memory buffer unit 1020 may include a static RAM (SRAM) or a dynamic RAM (DRAM).

The error correction unit 1030 may perform error correction. The ECC circuit 1030 may perform an ECC encoding operation based on data to be written to the memory device 100 through the memory interface 1060. ECC encoded data may be transmitted to the memory device through the memory interface 1060. The ECC circuit 1030 may perform an ECC decoding operation on data received from the memory device through the memory interface 1060. For example, the ECC circuit 1030 may be included in the memory interface 1060 as a component of the memory interface 1060.

The host interface 1040 may communicate with the external host under control of the processor 1010. The host interface 1040 may perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multiMedia card (MMC), an embedded MMC (eMMC), a dual in-line memory module (DIMM), a registered DIMM (RDIMM), and a load reduced DIMM (LRDIMM) communication methods.

The buffer control circuit 1050 may control the memory buffer 1020 under control of the processor 1010.

The memory interface 1060 may communicate with the memory device under control of the processor 1010. The memory interface 1060 may communicate a command, an address, and data with the memory device through the channel.

For example, the memory controller 1000 may include neither the memory buffer 1020 nor the buffer control circuit 1050.

For example, the processor 1010 may use codes to control the operation of the memory controller 1000. The processor 1010 may load codes from a nonvolatile memory device (e.g., a read only memory) provided in the memory controller 1000. Alternatively, the processor 1010 may load codes from the memory device through the memory interface 1060.

For example, the bus 1070 of the memory controller 1000 may be divided into a control bus and a data bus. The data bus may transmit data in the memory controller 1000. The control bus may transmit control information such as a command and an address in the memory controller 1000. The data bus and the control bus may be separated from each other and may neither interfere with each other nor affect each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 19:
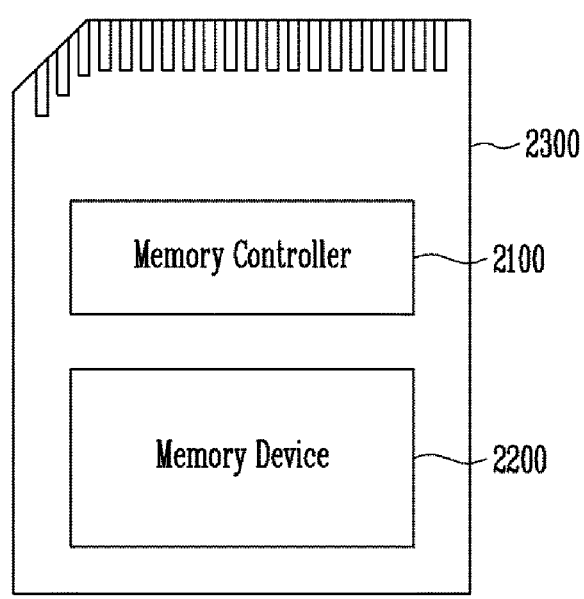
FIG. 19 is a block diagram illustrating an example of a memory card system implemented based on some embodiments of the disclosed technology.

FIG. 19 is a block diagram illustrating an example of a memory card system 2000 implemented based on some embodiments of the disclosed technology.

Referring FIG. 19, the memory card system 2000 may include a memory controller 2100, a memory device 2200 and a connector 2300.

The memory controller 2100 is coupled to the memory device 2200. The memory controller 2100 may access the memory device 2200. For example, the memory controller 2100 may control a read operation, a write operation, an erase operation, and a background operation of the memory device 2200. The memory controller 2100 may provide an interface between the memory device 2200 and the host. The memory controller 2100 may drive firmware for controlling the memory device 2200. The memory device 2200 may be embodied in the same manner as that of the memory device 100 described with reference to FIG. 4.

In an embodiment, the memory controller 2100 may include components such as a random access memory (RAM), a processing unit, a host interface, and a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented in various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

In an embodiment, the memory controller 2100 and the memory device 2200 may be integrated into a single semiconductor device to form a memory card. For example, the memory controller 2100 and the memory device 2200 may be integrated into a single semiconductor device to form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

Figure 20:
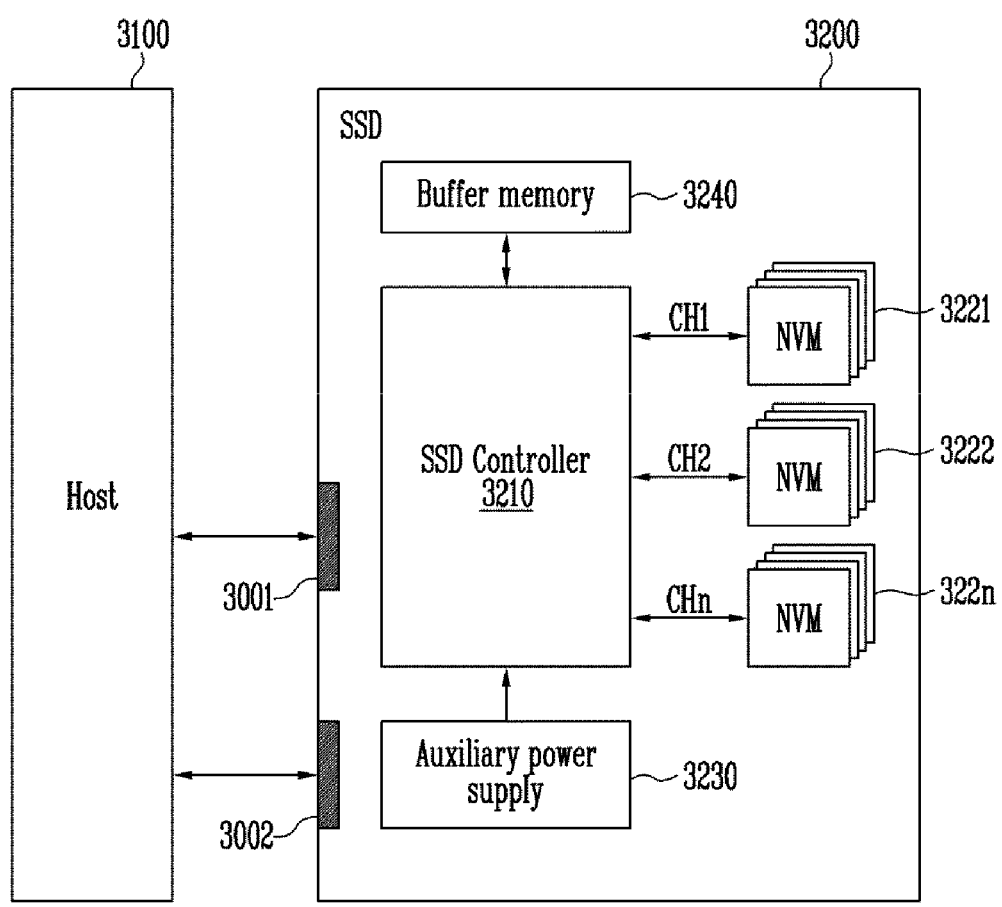
FIG. 20 is a block diagram illustrating an example of a solid state drive (SSD) system implemented based on some embodiments of the disclosed technology.

FIG. 20 is a block diagram illustrating an example of a solid state drive (SSD) system 3000 implemented based on some embodiments of the disclosed technology.

Referring to FIG. 20, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200, described above with reference to FIG. 1.

The SSD controller 3210 may control the plurality of flash memories 3221 to 322n in response to the signals SIG received from the host 3100. In an embodiment, the signals SIG may be signals based on an interface between the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100, and may be charged by the power PWR. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., a mapping table) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 21:
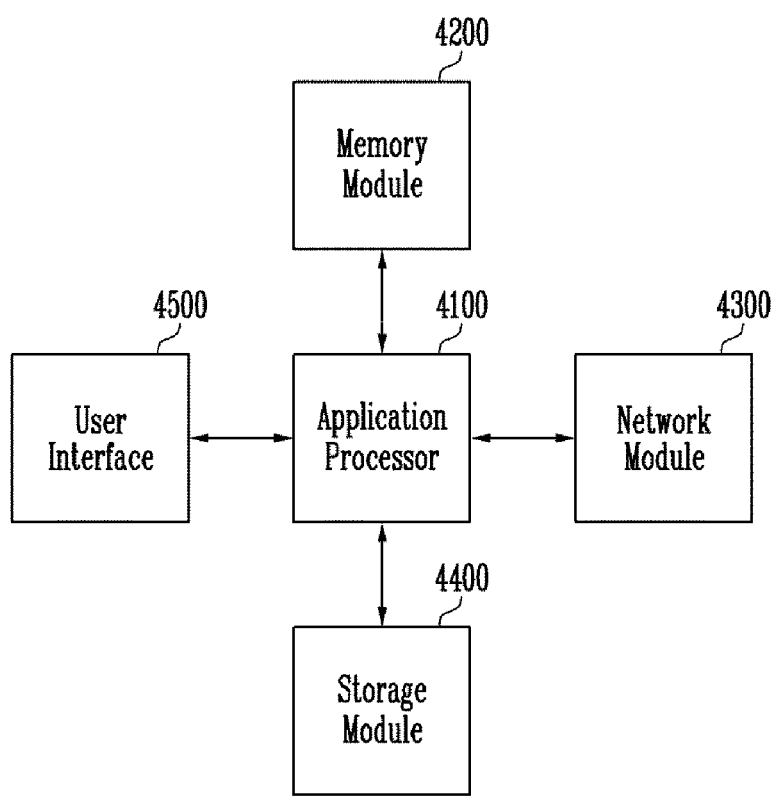
FIG. 21 is a block diagram illustrating an example of a user system implemented based on some embodiments of the disclosed technology.

FIG. 21 is a block diagram illustrating an example of a user system 4000 implemented based on some embodiments of the disclosed technology.

Referring to FIG. 21, the user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory, or a cache memory of the user system 4000. The memory module 4200 may include a volatile RAM such as a DRAM, an SDRAM, a DDR SDRAM, a DDR2 SDRAM, a DDR3 SDRAM, an LPDDR SDRAM, and an LPDDR3 SDRAM, or a nonvolatile RAM such as a PRAM, a ReRAM, an MRAM, and an FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or Wi-Fi communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, and each of the plurality of nonvolatile memory devices may be operated in the same manner as that of the memory device 100, described above with reference to FIGS. 3 and 6. The storage module 4400 may be operated in the same manner as that of the storage device 50, described above with reference to FIG. 1.

The user interface 4500 may include interfaces for inputting data or instructions to the application processor 4100 or outputting data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as an liquid crystal display (LCD), an organic light emitting diode (OLED) display device, an active matrix OLED (AMOLED) display device, an LED, a speaker, and a motor.

Various embodiments of the disclosed technology may provide a storage device having an enhanced operating speed, and a method of operating the storage device.

Although the embodiments of the disclosed technology have been disclosed, those skilled in the art will appreciate that various modifications, additions and substitutions are possible, without departing from the scope and spirit of the disclosed technology.

Therefore, the scope of the disclosed technology must be defined by the appended claims and equivalents of the claims rather than by the description preceding them.

In the above-discussed embodiments, all steps may be selectively performed or skipped. In addition, the steps in each embodiment may not be always performed in regular order. Furthermore, the embodiments disclosed in the present specification and the drawings aims to help those with ordinary knowledge in this art more clearly understand the disclosed technology rather than aiming to limit the bounds of the disclosed technology. In other words, one of ordinary skill in the art to which the disclosed technology belongs will be able to easily understand that various modifications are possible based on the technical scope of the disclosed technology.

Embodiments of the disclosed technology have been described with reference to the accompanying drawings, and specific terms or words used in the description should be construed in accordance with the spirit of the disclosed technology without limiting the subject matter thereof. It should be understood that many variations and modifications of the basic inventive concept described herein will still fall within the spirit and scope of the disclosed technology as defined in the appended claims and their equivalents.

What is claimed is:

1. A storage device comprising:
 a memory device including a plurality of memory blocks, each memory block including a plurality of memory cells located in a main area and a spare area within the memory device and respectively coupled to a plurality of corresponding word lines; and
 a memory controller coupled to communicate with the memory device and configured to store data in memory cells included in the main area coupled to a selected word line of the plurality of word lines, and store word-line information in memory cells included in the spare area coupled to the selected word line to indicate that a program operation has been performed on the main area,
 wherein a number of memory cells included in the spare area for storing the word-line information is determined according to a position of the selected word line.

2. The storage device according to claim 1, wherein the word-line information is stored in one or more memory cells coupled to one or more bit lines corresponding to the selected word line among the memory cells included in the spare area.

3. The storage device according to claim 1, wherein the word-line information is stored in the memory cells included in the spare area in a sequence from a memory cell coupled to an outermost bit line to a memory cell coupled to a last bit line.

4. The storage device according to claim 1,
 wherein the memory cells included in the spare area are divided into two or more groups, and
 wherein the word-line information is stored in at least one of the two or more groups.

5. The storage device according to claim 1, wherein the memory controller comprises:
 a sudden power off (SPO) sensing unit configured to sense an SPO event of loss of electrical power and to generate SPO event sensing information;
 a program history storage unit coupled to communicate with the SPO sensing unit and configured to provide, according to the SPO event sensing information from the SPO sensing unit, memory block information indicating a memory block on which a program operation has been performed last before the SPO event occurs among the plurality of memory blocks included in the memory device; and
 a last page read control unit coupled to communicate with the program history storage unit and the memory device, and configured to provide, to the memory device, a last page read command for requesting information about a last programmed page on which the program operation has been performed last among a plurality of pages included in the memory block on which the program operation has been performed last among the plurality of memory blocks.

6. The storage device according to claim 5, wherein, in response to the last page read command, the memory device provides the word-line information of the memory block on which the program operation has been programmed last among the plurality of memory blocks to the memory controller as last programmed page information.

7. The storage device according to claim 5, wherein, in response to the last page read command, the memory device provides data obtained by simultaneously reading the plurality of pages included in the memory block on which the program operation has been programmed last among the plurality of memory blocks to the memory controller as the information about the last programmed page.

8. The storage device according to claim 5, wherein, in response to the last page read command, the memory device simultaneously applies read voltages having an identical level, to the plurality of word lines coupled to the memory block on which the program operation has been performed last among the plurality of memory blocks, and reads the information about the last programmed page.

9. The storage device according to claim 5, wherein, in response to the last page read command, the memory device simultaneously applies read voltages having an identical level, to two or more of the plurality of word lines coupled to the memory block on which the program operation has been performed last among the plurality of memory blocks, and reads the information about the last programmed page.

10. The storage device according to claim 6, wherein the memory controller comprises a last page determination unit configured to locate the last programmed page using the last programmed page information.

11. A method of operating a storage device, comprising:
 controlling, as part of operation of the storage device, a plurality of memory cells coupled to each of a plurality of word lines coupled to one or more of a plurality of memory blocks included in a memory device;
 storing data in memory cells included in a main area among selected memory cells coupled to a selected word line of the plurality of word lines; and
 storing word-line information indicating a location of the selected word line in memory cells included in a spare area among the selected memory cells,
 wherein a number of memory cells included in the spare area for storing the word-line information is determined according to a position of the selected word line.

12. The method according to claim 11, wherein storing the word-line information comprises storing the word-line information in memory cells coupled to one or more bit lines corresponding to the selected word line among the memory cells included in the spare area.

13. The method according to claim 11, wherein storing the word-line information comprises storing the word-line information in the memory cell included in the spare area in a sequence from a memory cell coupled to an outermost bit line to a memory cell coupled to a last bit line.

14. The method according to claim 11, wherein the storing of the word-line information comprises:
dividing the memory cells included in the spare area into two or more groups; and
storing the word-line information in any one group of the two or more groups.

15. The method according to claim 11, further comprising:
sensing an occurrence of loss of power to the storage device to generate sensing information indicating a sensed occurrence of loss of power;
generating, according to the sensing information, memory block information indicating a memory block on which a program operation has been performed last before the sensed loss of power occurs among the plurality of memory blocks included in the memory device; and
providing, to the memory device, a last page read command for requesting information about a last programmed page on which the program operation has been performed last among a plurality of pages included in the memory block on which the program operation has been performed last among the plurality of memory blocks.

16. The method according to claim 15, further comprising:
performing a last page search read operation in response to the last page read command; and
generating and providing, in response to the last page read command, last programmed page information about the word-line information of the memory block on which the program operation has been performed last among the plurality of memory blocks.

17. The method according to claim 15, further comprising providing, in response to the last page read command, data obtained by simultaneously reading the plurality of pages included in the memory block on which the program operation has been performed last among the plurality of memory blocks, as the information about the last programmed page.

18. The method according to claim 15, further comprising simultaneously applying, in response to the last page read command, read voltages having an identical level, to the plurality of word lines coupled to the memory block on which the program operation has been performed last among the plurality of memory blocks, and reading the information about the last programmed page.

19. The method according to claim 15, further comprising simultaneously applying, in response to the last page read command, read voltages having an identical level, to two or more of the plurality of word lines coupled to the memory block on which the program operation has been performed last among the plurality of memory blocks, and reading the information about the last programmed page.

20. The method according to claim 15, further comprising detecting the last programmed page using the last programmed page information.

* * * * *